(12) United States Patent
Kim et al.

(10) Patent No.: US 10,204,910 B2
(45) Date of Patent: Feb. 12, 2019

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Jin A Kim, Hwaseong-si (KR); Sun Young Lee, Suwon-si (KR); Ji Young Kim, Yongin-si (KR); Chang Hyun Cho, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/722,085

(22) Filed: Oct. 2, 2017

(65) Prior Publication Data

US 2018/0175040 A1 Jun. 21, 2018

(30) Foreign Application Priority Data

Dec. 16, 2016 (KR) ........................ 10-2016-0172380

(51) Int. Cl.
| | | |
|---|---|---|
| *H01L 27/108* | (2006.01) | |
| *H01L 29/94* | (2006.01) | |
| *H01L 21/762* | (2006.01) | |
| *H01L 29/423* | (2006.01) | |

(52) U.S. Cl.
CPC .. *H01L 27/10829* (2013.01); *H01L 21/76224* (2013.01); *H01L 27/1087* (2013.01); *H01L 27/10823* (2013.01); *H01L 27/10876* (2013.01); *H01L 29/4236* (2013.01)

(58) Field of Classification Search
None
See application file for complete search history.

(56) References Cited

U.S. PATENT DOCUMENTS

| | | |
|---|---|---|
| 7,276,410 B2 | 10/2007 | Bae |
| 7,361,550 B2 | 4/2008 | Kim |
| 7,790,620 B2 | 9/2010 | Nam et al. |
| 8,975,140 B2 | 3/2015 | Chung |
| 9,123,576 B2 | 9/2015 | Lee |
| 2014/0327056 A1* | 11/2014 | Park ........................ H01L 29/78 257/288 |
| 2016/0181385 A1* | 6/2016 | Kim .................. H01L 29/66621 257/4 |

FOREIGN PATENT DOCUMENTS

| | | |
|---|---|---|
| KR | 1020080114183 | 12/2008 |
| KR | 101139987 | 4/2012 |

* cited by examiner

*Primary Examiner* — Calvin Y Choi
(74) *Attorney, Agent, or Firm* — F. Chau & Associates, LLC

(57) ABSTRACT

A semiconductor device is provided. The provided semiconductor device may have enhanced reliability and operating characteristics. The semiconductor device includes a substrate, a device isolation film formed within the substrate, a first gate structure formed within the substrate, a recess formed on at least one side of the first gate structure and within the substrate and the device isolation film, the recess comprising an upper portion and a lower portion wherein the lower portion of the recess is formed within the substrate and the upper portion of the recess is formed across the substrate and the device isolation film, a buried contact filling the recess and an information storage electrically connected to the buried contact.

28 Claims, 26 Drawing Sheets

SEMICONDUCTOR DEVICE AND METHOD FOR FABRICATING THE SAME

CROSS-REFERENCE TO RELATED APPLICATION

This application claims priority under 35 U.S.C. 119 to Korean Patent Application No. 10-2016-0172380 filed on Dec. 16, 2016 in the Korean Intellectual Property Office, the content of which in its entirety is herein incorporated by reference.

TECHNICAL FIELD

The present disclosure relates to a semiconductor device and a method for fabricating the same, and more particularly, to a semiconductor device comprising a plurality of wire lines and buried contacts, which are intersecting each other, and a fabricating method thereof.

DISCUSSION OF RELATED ART

As semiconductor devices continue to be highly integrated, circuit patterns are further miniaturized to pack more semiconductor devices into the same area. That is, the increased integration density of the semiconductor device causes reduced design rules with respect to the constituent elements of the semiconductor device.

In a highly scaled semiconductor device, a process of forming a plurality of wire lines and a plurality of buried contacts BC interposed therebetween to fabricate a reliable device becomes more complicated and difficult to achieve.

SUMMARY

The present inventive concept provides a semiconductor device to have enhanced reliability and operating characteristics by adjusting the profile of bottom surfaces of recesses where buried contacts are formed.

The present inventive concept also provides a method of fabricating a semiconductor device to have enhanced reliability and operating characteristics by adjusting the profile of bottom surfaces of recesses where buried contacts are formed.

According to an exemplary embodiment of the present inventive concept, there is provided a semiconductor device including a substrate, a device isolation film formed within the substrate, a first gate structure formed within the substrate, a recess formed on at least one side of the first gate structure and within the substrate and the device isolation film, the recess including an upper portion and a lower portion, in which the lower portion of the recess is formed within the substrate and the upper portion of the recess is formed across the substrate and the device isolation film, a buried contact filling the recess and an information storage electrically connected to the buried contact.

According to an exemplary embodiment of the present inventive concept, there is provided a semiconductor device including a substrate, a device isolation film formed within the substrate, a recess formed within the substrate and the device isolation film and including a first portion vertically overlapping the substrate and a second portion vertically overlapping the device isolation film, in which a depth of the first portion of the recess is greater than a depth of the second portion of the recess, and a bottom surface of the second portion of the recess is lower than an upper surface of the substrate, a buried contact filling the recess and a capacitor electrically connected to the buried contact.

According to an exemplary embodiment of the present inventive concept, there is provided a semiconductor device including a device isolation film within a substrate, a plurality of word lines within the substrate and the device isolation film, the plurality of word lines being formed across the substrate and the device isolation film and extending in a first direction, a plurality of bit lines on the substrate and the device isolation film, the plurality of bit lines extending in a second direction different from the first direction and intersecting the word lines, a buried contact between the adjacent word lines and between the adjacent bit lines, the buried contact overlapping the substrate and the device isolation film, in which a height of the buried contact overlapping the substrate is greater than a height of the buried contact overlapping the device isolation film and a capacitor electrically connected to the buried contact.

According to an exemplary embodiment of the present inventive concept, there is provided a semiconductor device including a device isolation film defining an active region within a substrate, first and second gate structures formed adjacent to each other within the substrate, a direct contact electrically connected to the substrate between the first gate structure and the second gate structure, a bit line on the direct contact, a recess formed within the substrate and the device isolation film and including a first portion vertically overlapping the substrate and a second portion vertically overlapping the device isolation film, in which a depth of the first portion of the recess is greater than a depth of the second portion of the recess, a buried contact filling the recess, wherein the first gate structure is positioned between the buried contact and the direct contact and a capacitor electrically connected to the buried contact.

According to an exemplary embodiment of the present inventive concept, there is provided a method for fabricating a semiconductor device including forming a device isolation film within a silicon substrate, forming a plurality of word lines extending in a first direction within the silicon substrate and the device isolation film, forming a plurality of bit lines extending in a second direction different from the first direction on the silicon substrate, forming a recess within the silicon substrate and the device isolation film by removing the silicon substrate and the device isolation film between adjacent word lines and between adjacent bit lines, forming a buried contact filling the recess and forming a capacitor on the buried contact, with the capacitor being electrically connected to the buried contact, in which the recess comprises a first portion vertically overlapping the silicon substrate, and a second portion vertically overlapping the device isolation film, and a depth from an upper surface of the silicon substrate to a bottom surface of the first portion of the recess is greater than a depth from the upper surface of the silicon substrate to a bottom surface of the second portion of the recess.

According to an exemplary embodiment of the present inventive concept, there is provided a semiconductor device including a substrate, a device isolation film formed within the substrate, the device isolation film including a first portion and a second portion adjacent to and spaced apart from the first portion, a first bit line formed on the substrate, and a second bit line formed on the second portion of the device isolation film, a bit line contact formed to electrically connect the first bit line and the substrate at one side of the first portion of the device isolation film away from the second portion of the device isolation film, a buried contact formed between the first bit line and the second bit line, the buried contact overlapping the substrate and the first portion of the device isolation film, and a capacitor formed over the buried contact and electrically connected to the buried contact, in which a height of the buried contact overlapping the substrate is greater than a height of the buried contact overlapping the first portion of the device isolation film.

BRIEF DESCRIPTION OF THE DRAWINGS

The above and other features of the present inventive concept will become more apparent to those of ordinary skill in the art by describing in detail exemplary embodiments thereof with reference to the accompanying drawings, in which.

Figure 1:
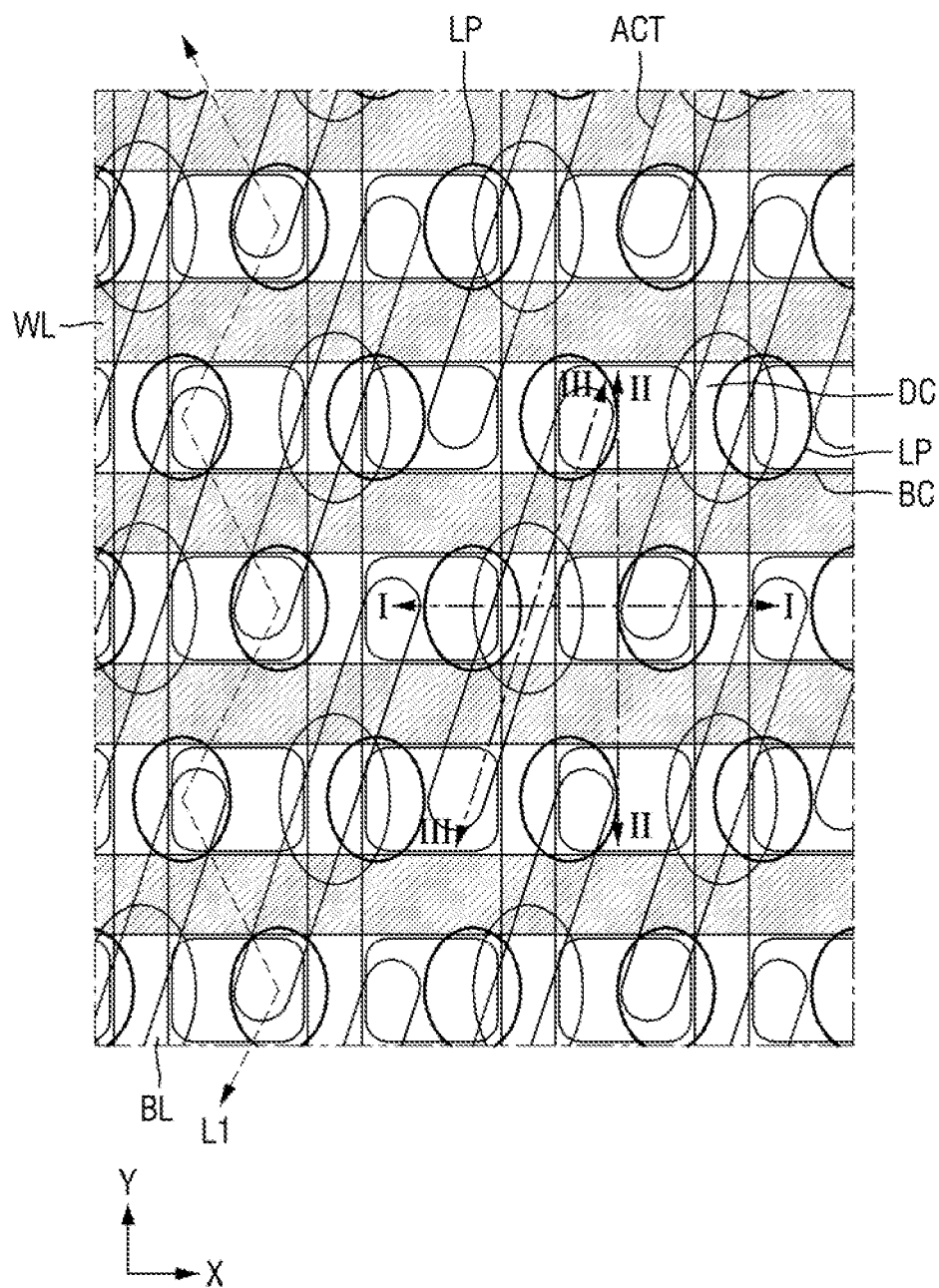
FIG. 1 is a schematic layout view provided to explain a semiconductor device according to an exemplary embodiment of the present inventive concept.

Since the drawings in FIGS. 1-18B are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 2:
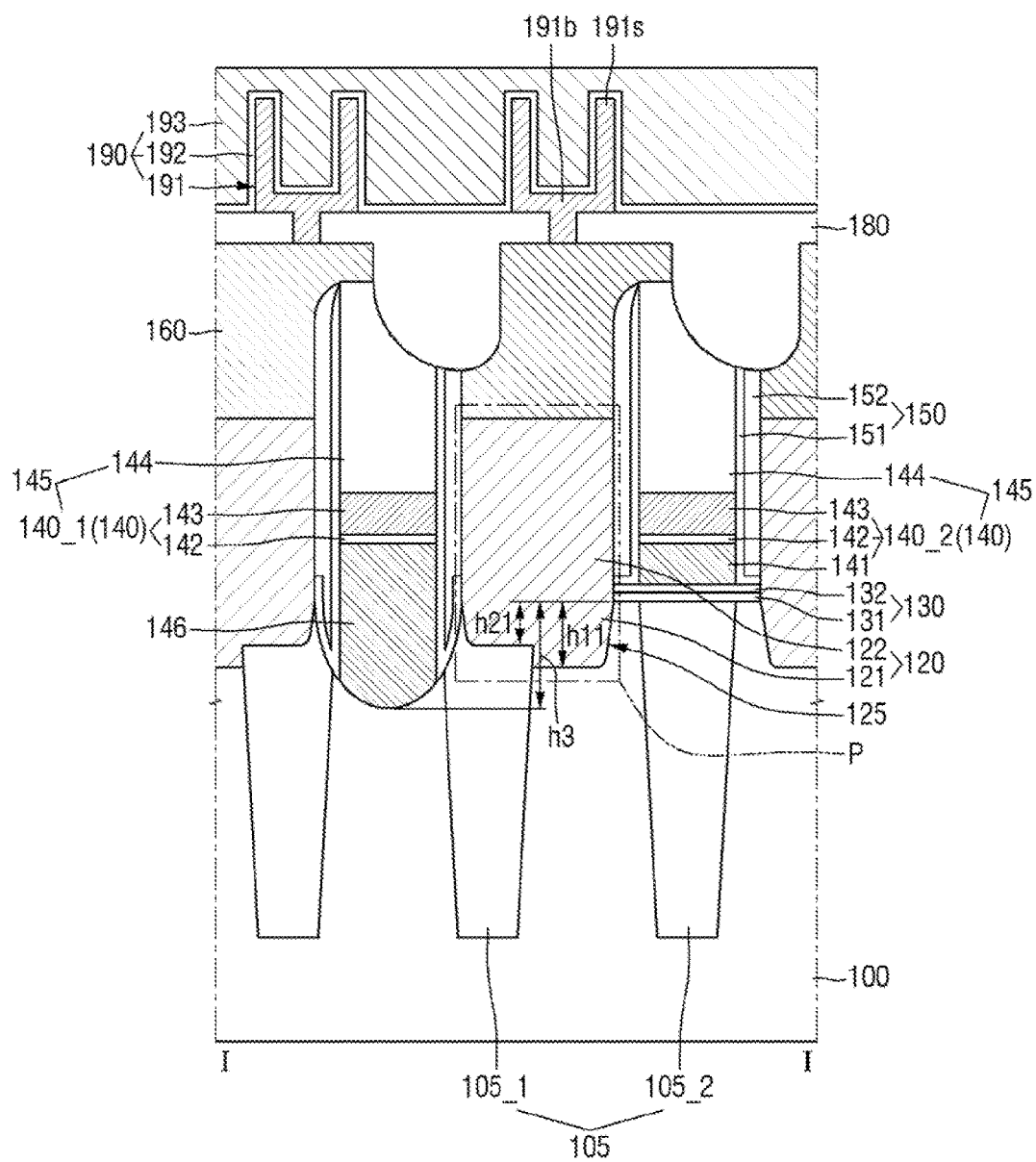
FIG. 2 is a cross sectional view taken along line I-I of FIG. 1.
Figure 3:
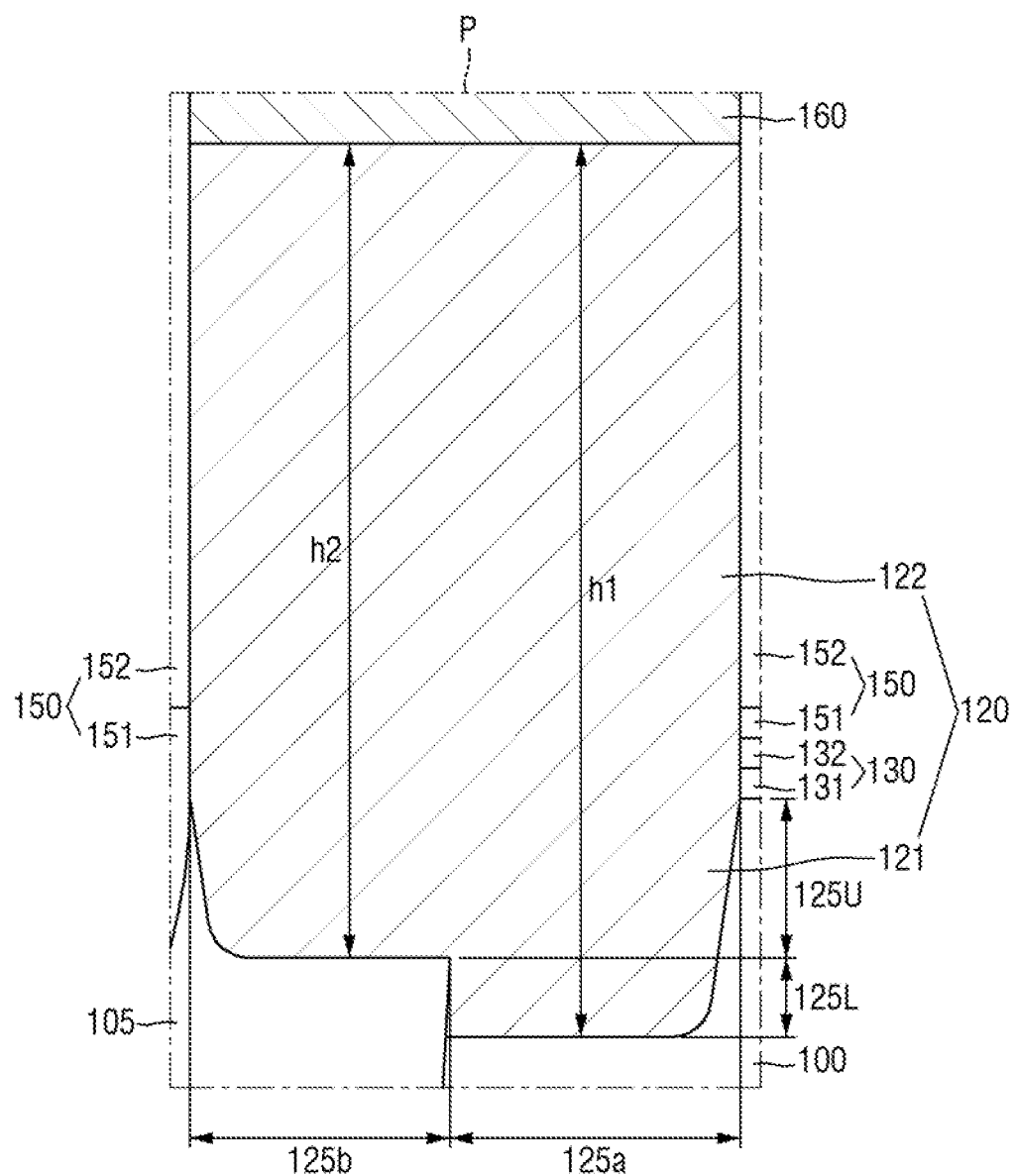
FIG. 3 is an enlarged view of an encircled section P of FIG. 2.
Figure 4:
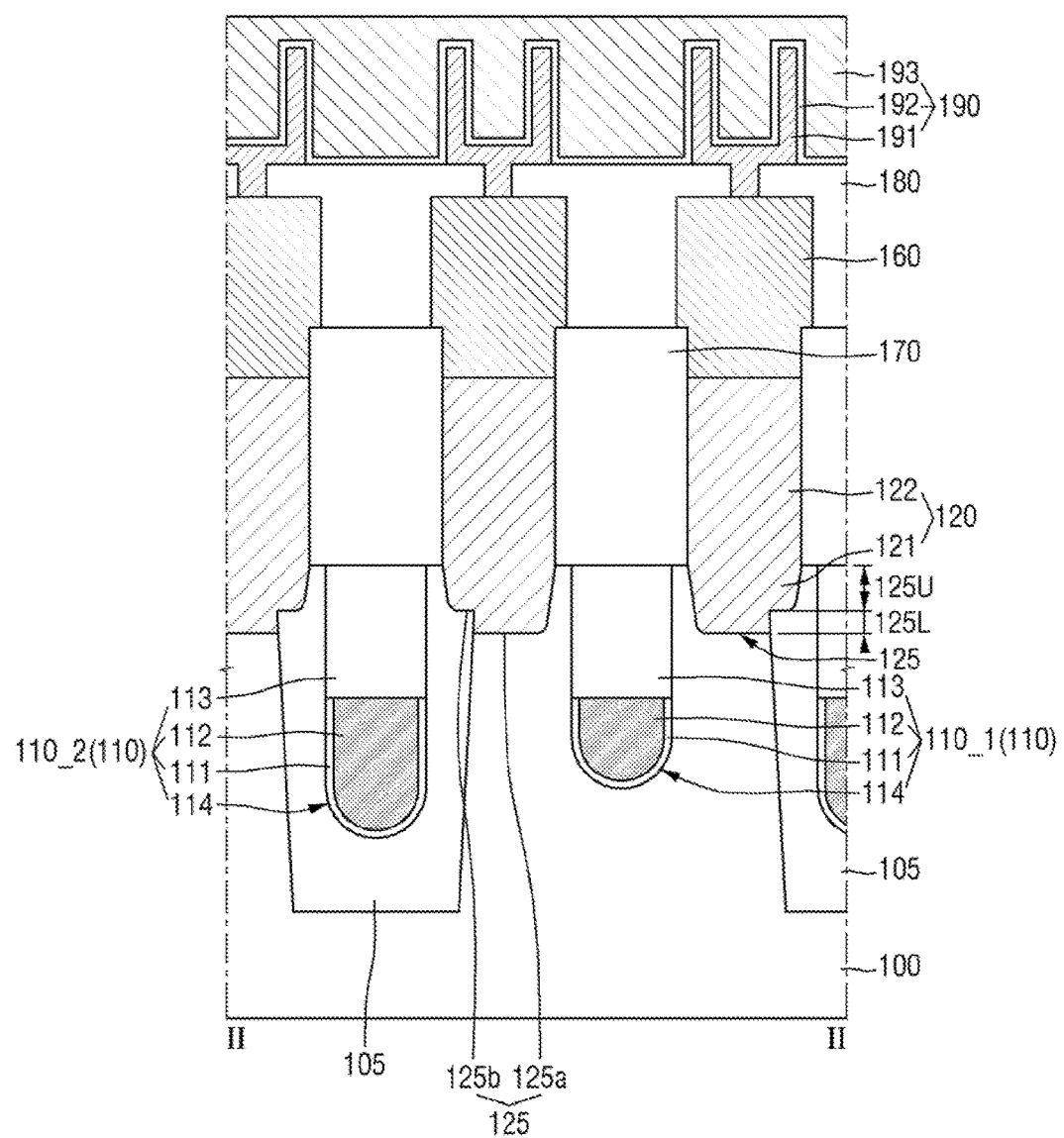
FIG. 4 is a cross sectional view taken along line II-II of FIG. 1.
Figure 5:
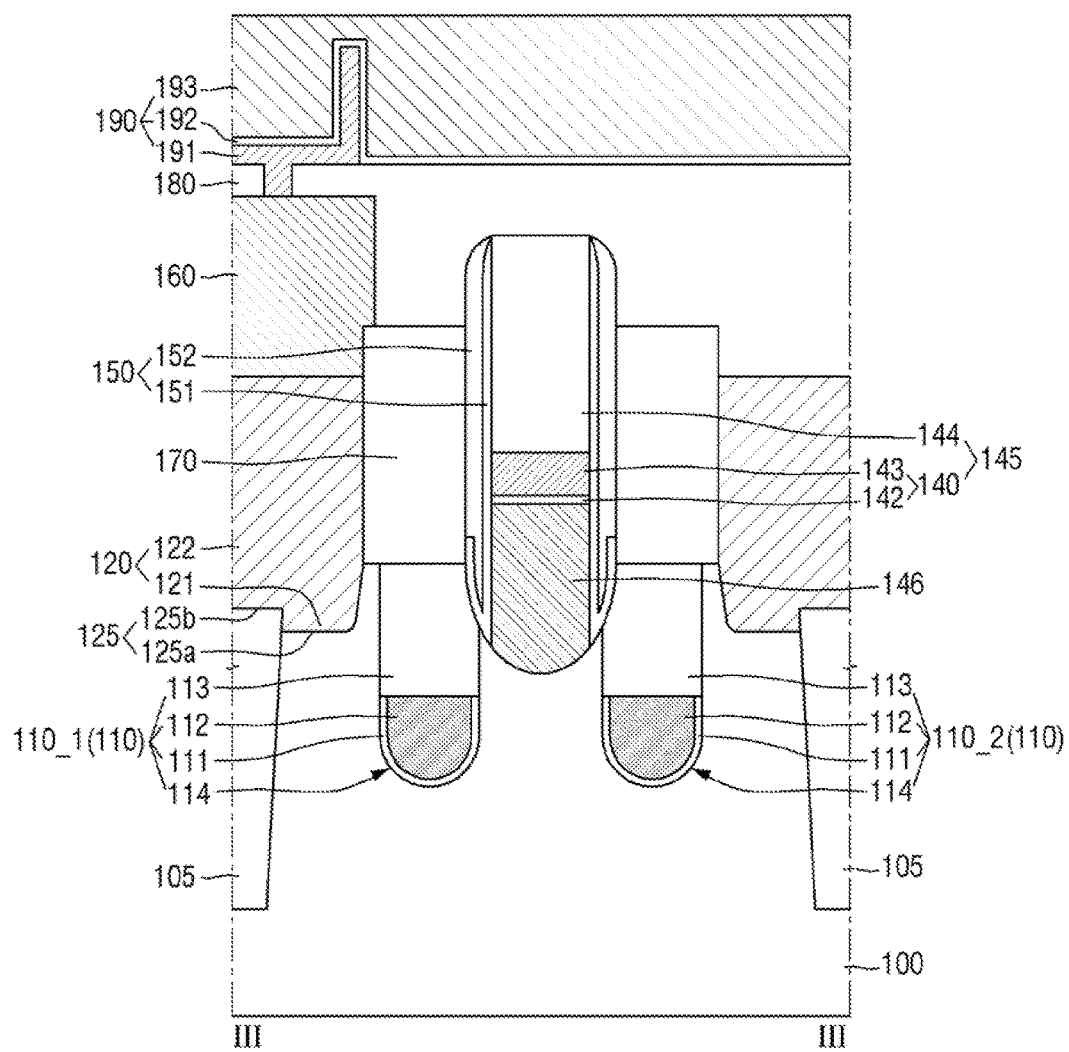
FIG. 5 is a cross sectional view taken along line III-III of FIG. 1.

FIG. 1 is a schematic layout view provided to explain a semiconductor device according to an exemplary embodiment of the present inventive concept. FIG. 2 is a cross sectional view taken along line I-I of FIG. 1. FIG. 3 is an enlarged view of an encircled section P of FIG. 2. FIG. 4 is a cross sectional view taken along line II-II of FIG. 1. FIG. 5 is a cross sectional view taken along line III-III of FIG. 1.

Although a dynamic random access memory (DRAM) is exemplified in the drawings of a semiconductor device according to an exemplary embodiment of the present inventive concept, the present inventive concept is not limited thereto.

Referring to FIG. 1, the semiconductor device according to an exemplary embodiment of the present inventive concept may include a plurality of active regions ACT. The active regions ACT may be defined by a device isolation film 105 (see FIG. 2), and may be formed within a substrate 100 (see FIG. 2).

With decreased design rule of the semiconductor device, the active regions ACT may be disposed in a bar-like form of diagonal lines or oblique lines, as illustrated. By depositing the active regions ACT in a direction of a diagonal line or an oblique line, a maximum possible distance between contacts may be provided for the semiconductor device.

On the active regions ACT and across the active regions ACT, a plurality of gate electrodes may be disposed along a first direction X. The plurality of gate electrodes may extend parallel to each other in the first direction, and may be spaced apart from each other in a second direction Y. The plurality of gate electrodes may be, for example, a plurality of word lines WL.

The word lines WL may be disposed at a uniform pitch. A width of the word lines WL or a pitch between the word lines WL may be determined according to the design rule.

On the word lines WL and orthogonal to the word lines WL, a plurality of bit lines BL extending in the second direction Y may be disposed. The plurality of bit lines BL may extend parallel to each other in the second direction Y, and may be spaced apart from each other in the first direction X.

The bit lines BL may be disposed at a uniform pitch. A width of the bit lines BL or a pitch between the bit lines BL may be determined according to the design rule.

In an exemplary embodiment of the present inventive concept, the bit lines BL may be disposed at 3F pitch in parallel with each other. Further, the word lines WL may be disposed at 2F pitch in parallel with each other.

As used herein, 'F' may indicate a 'minimum lithographic feature size'. When the bit lines BL and the word lines WL are disposed at the pitch described above, the semiconductor device may include memory cells having $6F^2$ unit cell size.

The semiconductor device according to an exemplary embodiment of the present inventive concept may include various contact arrangements formed on the active regions ACT. Various contact arrangements may include, for example, direct contacts DC, buried contacts BC, landing pads LP, and the like.

In an example, the direct contact DC may indicate a contact for electrically connecting the active region ACT to the bit line BL. The buried contact BC may indicate a contact for connecting the active region ACT to a lower electrode 191 (see FIG. 2) of a capacitor.

Given the structure in which the elements are disposed, contact area of the buried contact BC and the active region ACT may be small. Accordingly, a conductive landing pad LP may be introduced to expand the contact area with the active region ACT and also to expand the contact area with the lower electrode 191 (see FIG. 2) of the capacitor.

The landing pads LP may be disposed between the active regions ACT and the buried contacts BC or between the buried contacts BC and the lower electrode of the capacitor. In the semiconductor device according to an exemplary embodiment of the present inventive concept, the landing pads LP may be disposed between the buried contacts BC and the lower electrode of the capacitor. As the contact area is expanded with the introduction of the landing pads LP, the contact resistance between the active regions ACT and the lower electrode of the capacitor may decrease.

In the semiconductor device according to an exemplary embodiment of the present inventive concept, the direct contacts DC may each be disposed on a center region of the active region ACT. The buried contacts BC may be disposed on both ends of the active regions ACT.

As the buried contacts BC are disposed on both ends of the active regions ACT, the landing pads LP may be disposed to be adjacent to both ends of the active regions ACT, while partially overlapping the buried contacts BC. In other words, the buried contacts BC may be formed to overlap the active regions ACT and the device isolation film 105 (see FIG. 2) between the adjacent word lines WL and the adjacent bit lines BL.

The word lines WL may be formed in a structure buried within the substrate 100. The word lines WL may be disposed across the active regions ACT between the direct contacts DC or the buried contacts BC.

As illustrated, the two word lines WL may be disposed across one active region ACT. As the active regions ACT are disposed in a diagonal line, the word lines WL may have an angle of less than 90 degrees, an acute angle, with the active regions ACT.

The direct contacts DC and the buried contacts BC may be disposed symmetrically about X and Y axes. As a result, the direct contacts DC and the buried contacts BC may be disposed on a straight line along the first direction X and the second direction Y.

Differently from the direct contacts DC and the buried contacts BC, the landing pads LP may be disposed in a zigzag form L1 along the second direction Y in which the bit lines BL extend. Further, the landing pads LP may be disposed to overlap the same side surface of each bit line BL in the first direction X in which the word lines WL extend. For example, each of the landing pads LP at a first line may overlap a left side surface of the corresponding bit line BL, and each of the landing pads LP at a second line may overlap a right side surface of the corresponding bit line BL.

Referring to FIGS. 1 to 5, the semiconductor device according to an exemplary embodiment of the present inventive concept may include the device isolation film 105, a plurality of gate structures 110, a plurality of wire conductive films 140, a bit line contact 146, a storage contact 120, and an information storage 190.

The substrate 100 may be a bulk silicon (Si) or a silicon-on-insulator (SOI). Alternatively, the substrate 100 may include another material such as, for example, silicon germanium (SiGe), silicon germanium on insulator (SGOI), silicon carbide (SiC), indium antimonide (InSb), lead telluride (PbTe), indium arsenide (InAs), indium phosphide (InP), gallium arsenide (GaAs), gallium phosphide (GaP), or gallium antimonide (GaSb), but the present inventive concept is not limited thereto. In the following description, it is assumed that the substrate 100 is a silicon substrate.

The device isolation film 105 may be formed within the substrate 100. The device isolation film 105 may have a shallow trench isolation (STI) structure having excellent device isolation characteristics. The device isolation film 105 may define the active regions ACT within the substrate 100.

The active regions ACT defined by the device isolation film 105 may have a long island form (or a bar like form) including a short axis and a long axis, as illustrated in FIG. 1. The active regions ACT may have a diagonal line form having an angle of less than 90 degrees with respect to the word lines WL formed within the device isolation films 105.

Further, the active regions ACT may have a diagonal line form having an angle of less than 90 degrees with respect to the bit lines BL formed on the device isolation film 105. That is, the active regions ACT may extend in a third direction that has a certain angle, for example, an acute angle, with respect to the first direction X and the second direction Y.

The device isolation film 105 may include at least one of, for example, a silicon oxide ($SiO_2$) film, a silicon nitride (SiN) film, and a silicon oxynitride (SiON) film, but the present inventive concept is not limited thereto. In the semiconductor device according to an exemplary embodiment of the present inventive concept, the device isolation film 105 includes a silicon oxide film.

In FIGS. 2, 4 and 5, it is illustrated that the device isolation film 105 is formed of one single insulating film, but this is only for convenience of explanation, and the present disclosure is not limited thereto.

FIGS. 4 and 5 illustrate that an upper surface of the device isolation film 105 and an upper surface of the substrate 100 are flush with each other, about coplanar with each other, but this is only for convenience of explanation, and the present inventive concept is not limited thereto.

The gate structure 110 may be formed within the substrate 100 and the device isolation film 105. The gate structure 110 may be formed across the device isolation film 105 and the active regions ACT defined by the device isolation film 105. That is, one gate structure 110 may be formed within the substrate 100 and the device isolation film 105 which are positioned in the first direction X in which the gate structure 110 extends.

In the cross sectional view of FIG. 4 cut along the second direction Y between the adjacent bit lines BL (along line II-II) of FIG. 1, one (e.g., second gate structure 110_2) of the adjacent first and second gate structures 110_1, 110_2 may be formed within the device isolation film 105, and the other (e.g., first gate structure 110_2) may be formed within the substrate 100. Depending on the cutting location, the above described condition may be reversed between the first and second gate structures 110_1, 110_2.

In the cross sectional view of FIG. 5 cut along a direction in which the active regions ACT extend (along line III-III of FIG. 1), the adjacent first and second gate structures 110_1, 110_2 may be formed within the substrate 100 of the active region ACT defined by the device isolation film 105.

The gate structure 110 may include a gate trench 114 formed within the substrate 100 and the device isolation film 105, a gate insulating film 111, the gate electrode 112, and a gate capping pattern 113. In an example, the gate electrode 112 may correspond to the word lines WL.

The gate insulating film 111 may extend along a sidewall and a bottom surfaces of the gate trench 114. The gate insulating film 111 may extend along a profile of at least a portion of the gate trench 114. The extending along the profile of the gate trench 114 is to cover and extend along the bottom and sidewall surfaces of the gate trench 114 from the lower portion upward.

The first gate insulating film 111 may include, for example, silicon oxide ($SiO_2$), silicon nitride (SiN), silicon oxynitride (SiON) or a high-k dielectric material with a dielectric constant higher than that of silicon oxide. For example, the high-k dielectric material may include one or more of hafnium oxide ($HfO_2$), hafnium silicon oxide (HfSiO), hafnium aluminum oxide (HfAlO), lanthanum oxide ($La_2O_3$), lanthanum aluminum oxide ($LaAlO_3$), zirconium oxide ($ZrO_2$), zirconium silicon oxide (ZrSiO), tantalum oxide ($Ta_2O_5$), titanium oxide ($TiO_2$), barium strontium titanium oxide ($BaSrTi_2O_6$), barium titanium oxide (Ba- $TiO_3$), strontium titanium oxide ($SrTiO_3$), yttrium oxide ($Y_2O_3$), aluminum oxide ($Al_2O_3$), lead scandium tantalum oxide (Pb(Sc,Ta)O3), lead zinc niobate ($Pb(Zn_{1/3}Nb_{2/3})O_3$), and a combination thereof.

While the high-k dielectric material described above is explained mainly with reference to oxides, alternatively, the high-k dielectric material may include one or more of nitrides (e.g., hafnium nitride), or one or more of oxynitrides (e.g., hafnium oxynitride) of the metal materials (e.g., hafnium) described above, but the present inventive concept is not limited thereto.

The gate electrode 112 may be formed on the gate insulating film 111. The gate electrode 112 may fill a portion of the gate trench 114. For example, the gate electrode 112 may fill the portion of the gate trench having the gate insulating film 111 covering the inner wall surface of the trench.

The first gate electrode 112 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof.

The gate electrode 112 may include, for example, conductive metal oxide, conductive metal oxynitride or the like, or an oxidized form of the metal material from the aforementioned material.

The gate capping pattern 113 may be formed on the gate electrode 112. The gate capping pattern 113 may fill the rest of the gate trench 114 remaining after the gate electrode 112 is formed. The gate capping pattern 113 may include, for example, at least one of silicon nitride (SiN), silicon oxynitride (SiON), silicon oxide ($SiO_2$), silicon carbonitride (SiCN), silicon oxycarbonitride (SiOCN) and a combination thereof.

In FIGS. 4 and 5, it is illustrated that an upper surface of the gate capping pattern 113, an upper surface of the device isolation film 105, and an upper surface of the substrate 100 are flush with one another, about coplanar with one another, but this is only for convenience of explanation and the present inventive concept is not limited thereto. Further, it is illustrated that the gate insulating film 111 does not extend along a sidewall of the gate capping pattern 113, but the present inventive concept is not limited thereto.

In FIG. 4, the position of a lowermost portion of the first gate structure 110_1 formed within the substrate 100 may be different from the position of a lowermost portion of the second gate structure 110_2 formed within the device isolation film 105. For example, a distance from the information storage 190 to the lowermost portion of the first gate structure 110_1 may be smaller than a distance from the information storage 190 to the lowermost portion of the second gate structure 110_2.

In a process of forming the gate trench 114, the etch rate of the substrate 100 may be different from the etch rate of the device isolation film 105. Accordingly, the position of the lowermost portion of the first gate structure 110_1 formed within the substrate 100 may be different from the position of the lowermost portion of the second gate structure 110_2 formed within the device isolation film 105.

Because the first and second gate structures 110_1, 110_2 are formed across the substrate 100 and the device isolation film 105, a bottom surface of each of the first and second gate structures 110_1, 110_2 may have an uneven shape with increasing and decreasing distance to the information storage 190 along the first direction X.

An impurity doping region may be formed in the substrate on at least one side of the gate structure 110. The impurity doping region may be a source/drain region of the transistor.

The wire conductive film 140 may be formed on the substrate 100 and the device isolation film 105 in which the gate structure 110 is formed. The wire conductive film 140 may intersect the device isolation film 105 and the active regions ACT defined by the device isolation film 105. That is, one wire conductive film 140 may be formed on the substrate 100 and the device isolation film 105 which are positioned in the second direction Y in which the wire conductive film 140 extends. The wire conductive film 140 may be formed to intersect the gate structure 110 which extends in the first direction X. In an example, the wire conductive film 140 may correspond to the bit lines BL.

The wire conductive film 140 may be a single-layered film, but may be a multi-layered film as illustrated. When the wire conductive film 140 is a multi-layered film, the wire conductive film 140 may include, for example, a first conductive film 141, a second conductive film 142, and a third conductive film 143, but the present inventive concept is not limited thereto. The first to third conductive films 141, 142, 143 may be sequentially stacked on the substrate 100 and the device isolation film 105.

The first to third conductive films 141, 142, 142 may each include, for example, at least one of semiconductor material doped with impurity, conductive silicide compound, conductive metal nitride and metal. For example, the first conductive film 141 may include doped semiconductor material, the second conductive film 142 may include conductive silicide compound, and the third conductive film 143 may include at least one of conductive metal nitride and metal, but the present inventive concept is not limited thereto.

The bit line contact 146 may be formed between the wire conductive film 140 and the substrate 100. That is, the wire conductive film 140 may be formed on the bit line contact 146.

The bit line contact 146 may be formed at an intersection between the wire conductive film 140 and the active region ACT having a long island shape. The bit line contact 146 may be formed between the substrate 100 and the wire conductive film 140 at the center of the active region ACT.

The bit line contact 146 may electrically connect the wire conductive film 140 and the substrate 100. More specifically, the bit line contact 146 may electrically connect the impurity doping region of the substrate 100 between the adjacent gate structures 110 to the wire conductive film 140. In an example, the bit line contact 146 may correspond to the direct contact DC. In other words, the bit line contact 146 may be electrically connected to the source/drain region of a transistor or transistors.

In FIG. 5, a depth from an upper surface of the gate structure 110 to a bottom surface of the bit line contact 146 may be smaller than a depth from an upper surface of the gate structure 110 to a lower surface of the gate capping pattern 113.

The bit line contact 146 may include, for example, at least one of semiconductor material doped with impurity, conductive silicide compound, conductive metal nitride and metal.

In the cross sectional view of FIG. 2 cut along the first direction X between the adjacent word lines WL (along line I-I) of FIG. 1, one (e.g., first wire conductive film 140_1) of the adjacent first and second wire conductive films 140_1, 140_2 may be formed on the device isolation film 105, and the other (e.g., second wire conductive film 140_2) may be formed on the substrate 100 of the active region ACT defined by the device isolation film 105. Depending on the cutting location, the above described condition may be reversed between the first and second wire conductive films 140_1, 140_2.

In the cross sectional view cut along the first direction X, the active regions ACT included in the device isolation film 105 and the substrate 100 may be disposed between the adjacent first and second wire conductive films 140_1, 140_2.

The second wire conductive film 140_2 on the device isolation film 105, in which the bit line contact 146 is not formed, may include the first to third conductive films 141, 142, 143. The first wire conductive film 140_1 on the substrate 100 having the bit line contact 146 formed therewith may include, for example, the second conductive film 142 and the third conductive film 143. A portion of the bit line contact 146 may be disposed in a position where the first conductive film 141 of the second wire conductive film 140_2 is formed. In other words, the bit line contact 146 and the first conductive film 141 may be formed at the same process step. This will be described with reference to a fabricating method.

The first wire conductive film 140_1, which is elongated in the second direction Y and when it is on the device isolation film 105 having no bit line contact 146 formed therewith, may include the first to third conductive films 141, 142, 143, like the second wire conductive film 140_2. That is, because the first and second wire conductive films 140_1, 140_2 are formed across the substrate 100 and the device isolation film 105, they may each intersects the centers of the active regions ACT at different locations and having the bit line contacts 146 at these intersections along the second direction Y. At the same time, each of the first and second wire conductive films 140_1, 140_2 may be on the device isolation film 105 at different locations and may include the first to third conductive films 141, 142, 143 at these location along the second direction Y.

The bit line contact 146 may include, for example, at least one of semiconductor material doped with impurity, conductive silicide compound, conductive metal nitride and metal. For example, the bit line contact 146 may include doped semiconductor material, but the present inventive concept is not limited thereto.

A wire capping film 144 may be disposed on the wire conductive film 140 and extending in the second direction Y. In an example, the wire capping film 144 may include the silicon nitride film, but the present inventive concept is not limited thereto.

The wire conductive film 140 and the wire capping film 144 may be included in a bit line structure 145. Space between the adjacent bit line structure 145 may vertically overlap the substrate 100 and the device isolation film 105. That is, the space between the adjacent bit line structure 145 may overlap the substrate 100 and the device isolation film 105 in a fourth direction Z, the thickness direction of the substrate. Here the vertical direction is the fourth direction Z.

A cell insulating film 130 may be formed on the substrate 100 and the device isolation film 105. More specifically, the cell insulating film 130 may be formed on the substrate 100 and the device isolation film 105 in which the bit line contact 146 is not formed. The cell insulating film 130 may be formed between the substrate 100 and the wire conductive film 140 and between the device isolation film 105 and the wire conductive film 140.

The cell insulating film 130 may be a single-layered film, or as illustrated, the cell insulating film 130 may be a multi-layered film including a first cell insulating film 131 and a second cell insulating film 132. For example, the first cell insulating film 131 may include an oxide film, and the second cell insulating film 132 may include a nitride film, but the present inventive concept is not limited thereto.

A wire spacer 150 may be disposed on sidewalls of the wire conductive film 140 and the wire capping film 144. Specifically, the wire spacer 150 may be formed on the substrate 100 and the device isolation film 105 at a portion of the wire conductive film 140 where the bit line contact 146 is formed. The wire spacer 150 may extend in the second direction Y on the sidewalls of the wire conductive film 140 and the wire capping film 144.

At a remaining portion of the wire conductive film 140 where the bit line contact 146 is not formed, the wire spacer 150 may be formed on the cell insulating film 130. The wire spacer 150 may extend in the second direction Y on the sidewalls of the wire conductive film 140 and the wire capping film 144.

The wire spacer 150 may be a single-layered film, or as illustrated, the wire spacer 150 may be a multi-layered film including a first spacer 151 and a second spacer 152. For example, the first and second spacers 151, 152 may include one of the silicon oxide film ($SiO_2$), the silicon nitride film (SiN), the silicon oxynitride film (SiON), the silicon oxycarbonitride (SiOCN), air, and a combination thereof, but the present inventive concept is not limited thereto.

A first interlayer insulating film 170 may be formed on the substrate 100 and the device isolation film 105. The first interlayer insulating film 170 may be formed to overlap the gate structure 110 formed within the substrate 100 and the device isolation film 105.

The first interlayer insulating film 170 may be formed on the gate structure 110 and elongated in the first direction X. The first interlayer insulating film 170 may intersect the bit line structure 145 extending in the second direction Y. Space not occupied by the first interlayer insulating film 170 may vertically overlap the substrate 100 and the device isolation film 105.

The first interlayer insulating film 170 may include, for example, at least one of silicon oxide, silicon nitride, silicon oxynitride, and a combination thereof. It is illustrated that the first interlayer insulating film 170 is a single-layered film, but this is only for convenience of explanation, and the present inventive concept is not limited thereto.

In FIG. 5, a height from an upper surface of the substrate 100 to an upper surface of the first interlayer insulating film 170 is smaller than a height from the upper surface of the substrate 100 to an upper surface of the bit line structure 145, but the present inventive concept is not limited thereto.

A buried contact recess 125 may be formed within the substrate 100 and the device isolation film 105 between the adjacent gate structures 110 and between the adjacent wire conductive films 140. The buried contact recess 125 may be formed across the substrate 100 and the device isolation film 105. That is, one portion of the buried contact recess 125 formed may be within the substrate 100, the other portion of the buried contact recess 125 formed may be within the device isolation film 105, and these two portions together may be formed across the border of the substrate 100 and the device isolation film 105.

The buried contact recess 125 may be formed on at least one side of the gate structure 110. Further, the buried contact recess 125 may be formed on at least one side of the wire conductive film 140.

In the cross sectional view illustrated in FIG. 2, the device isolation film 105 may include a first region 105_1 and a second region 105_2. The first region 105_1 of the device isolation film and the second region 105_2 of the device isolation film may be adjacent to each other, and separated from each other. Among the adjacent first and second wire conductive films 140_1, 140_2, the first wire conductive film 140_1 connected with the bit line contact 146 may be formed on the substrate 100. The second wire conductive film 140_2 may be formed on the second region 105_2 of the device isolation film.

Between the adjacent first and second wire conductive films 140_1, 140_2, the substrate 100 and the first region 105_1 of the device isolation film may be disposed. In FIG. 2, the buried contact recess 125 may be formed in the first region 105_1 of the device isolation film and within the substrate 100 between the first region 105_1 of the device isolation film and the second region 105_2 of the device isolation film.

Since the wire conductive film 140 may correspond to the bit lines BL, the adjacent first and second wire conductive films 140_1, 140_2 may correspond to a first bit line and a second bit line, respectively. The device isolation film 105 may include a plurality of portions or regions spaced apart from each other, and may include the first region or portion 105_1 and the second portion or region 105_2, which are adjacent to each other. The buried contact recess 125 may be filled with buried contact BC. Thus, the first bit line may be formed on the substrate 100, the second bit line may be formed on the device isolation film 105, and the bit line contact may electrically connect the substrate 100 and the first bit line, while having the buried contact BC interposed between the first and second bit lines. The bit line contact may be formed at one side of the first portion 105_1 of the device isolation film away from the second portion 105_2 of the device isolation film. The buried contact BC is formed within the first portion 105_1 of the device isolation film and the substrate 100 between the first portion 105_1 of the device isolation film and the second portion 105_2 of the device isolation film, and the second bit line is formed on the second portion 105_2 of the device isolation film.

The buried contact recess 125 may include an upper portion 125U and a lower portion 125L. The upper portion 125U of the buried contact recess may be formed across the substrate 100 and the device isolation film 105. Meanwhile, the lower portion 125L of the buried contact recess may be formed within the substrate 100, but not formed within the device isolation film 105. In other words, the buried contact recess 125 may include a first portion 125a vertically overlapping the substrate 100, and a second portion 125b vertically overlapping the device isolation film 105. The buried contact recess 125 may connect a bottom surface of the first portion 125a of the buried contact recess to a bottom surface of the second portion 125b of the buried contact recess, and may include a connection sidewall defined by the device isolation film 105.

In the semiconductor device according to an exemplary embodiment of the present inventive concept, a depth h11 of the first portion 125a of the buried contact recess may be larger than a depth h21 of the second portion 125b of the buried contact recess. That is, the depth h11 from an upper surface of the gate structure 110 to the bottom surface of the first portion 125a of the buried contact recess may be greater than the depth h21 from the upper surface of the gate structure 110 to the bottom surface of the second portion 125b of the buried contact recess.

The distance h11 from the upper surface of the substrate 100 to the bottom surface of the first portion 125a of the buried contact recess may be greater than a distance h21 from the upper surface of the substrate 100 to the bottom surface of the second portion 125b of the buried contact recess. Accordingly, the bottom surface of the second portion 125b of the buried contact recess defined by the device isolation film 105 may be lower than the upper surface of the substrate 100. A distance from the information storage 190 to the upper surface of the substrate 100 may be smaller than a distance from the information storage 190 to the bottom surface of the second portion 125b of the buried contact recess.

The depth h11 from the upper surface of the substrate 100 to a lowermost portion of the buried contact recess 125, or the buried contact may be smaller than a depth h3 from the upper surface of the substrate 100 to a bottom surface of the bit line contact 146, e.g., to a lowermost portion of the bit line contact 146.

The depth h11 from the upper surface of the substrate 100 to the lowermost portion of the buried contact recess 125 may be smaller than a depth from the upper surface of the substrate 100 to the upper surface of the gate electrode 112. Further, a depth from the upper surface of the gate structure 110 to the lowermost portion of the buried contact recess 125 may be smaller than a depth from the upper surface of the gate structure 110 to the upper surface of the gate electrode 112. That is, a distance from an upper surface of the first gate structure 110_1 or the second gate structure 110_2 to an upper surface of the gate electrode 112 of the first gate structure 110_1 or the second gate structure 110_2 is greater than a distance from an upper surface of the first gate structure 110_1 or the second gate structure 110_2 to a bottom surface of the buried contact BC.

In FIGS. 2 to 5, a connection portion between the first portion 125a of the buried contact recess and the second portion 125b of the buried contact recess may have an angular shape. The connection portion is the portion where the bottom surface of the second portion 125b of the buried contact recess connects the sidewall surface of the first portion 125a of the buried contact recess.

The storage contact 120 may be formed between the adjacent gate structures 110 and between the adjacent wire conductive films 140. The storage contact 120 may overlap the substrate 100 and the device isolation film 105 between the adjacent gate structures 110 and between the adjacent wire conductive films 140. The gate structure 110 may be positioned between the storage contact 120 and the bit line contact 146. In an example, the storage contact 120 may correspond to the buried contact BC.

The storage contact 120 may fill the buried contact recess 125. That is, the buried contact BC may fill the buried contact recess 125. Further, the storage contact 120 may include a portion extending along a sidewall of the wire spacer 150 and a sidewall of the first interlayer insulating film 170.

The storage contact 120 may include a lower portion 121 and an upper portion 122. The lower portion 121 of the storage contact may fill the buried contact recess 125. That is, the lower portion 121 of the storage contact may be formed within the substrate 100 and the device isolation film 105. The upper portion 122 of the storage contact may be formed on the lower portion 121 of the storage contact. The upper portion 122 of the storage contact may extend along the sidewall of the wire spacer 150 and the sidewall of the first interlayer insulating film 170.

Referring to FIG. 4, the lower portion 121 of the storage contact may be disposed between the first gate structure 110_1 and the second gate structure 110_2. Thus, the buried contact BC may be positioned between the first gate structure 110_1 and the second gate structure 110_2.

Referring to FIG. 3, in the semiconductor device according to an exemplary embodiment of the present inventive concept, a height h1 of the storage contact 120 vertically overlapping the substrate 100 may be greater than a height h2 of the storage contact 120 vertically overlapping the device isolation film 105.

The depth h11 from the upper surface of the substrate 100 to the lowermost portion of the storage contact 120 may be smaller than the depth h3 from the upper surface of the substrate 100 to the bottom surface of the bit line contact 146, e.g., to the lowermost portion of the bit line contact 146.

The depth h11 from the upper surface of the substrate 100 to the lowermost portion of the storage contact 120 may be smaller than the depth from the upper surface of the substrate 100 to the upper surface of the gate electrode 112. Further, the depth from the upper surface of the gate structure 110 to the lowermost portion of the storage contact 120 may be smaller than the depth from the upper surface of the gate structure 110 to the upper surface of the gate electrode 112.

The upper surface of the storage contact 120 may be closer to the substrate 100 than the upper surface of the first interlayer insulating film 170 and the upper surface of the bit line structure 145.

The storage contact 120 may include, for example, at least one of semiconductor material doped with impurity, conductive silicide compound, conductive metal nitride and metal.

A storage pad 160 may be formed on the storage contact 120. The storage pad 160 may be electrically connected to the storage contact 120. In an example, the storage pad 160 may correspond to the landing pad LP.

The storage pad 160 may overlap a portion of the upper surface of the bit line structure 145, and may not overlap the entire upper surface of the bit line structure 145.

The storage pad 160 may include, for example, at least one of semiconductor material doped with impurity, conductive silicide compound, conductive metal nitride and metal.

A second interlayer insulating film 180 may be formed on the storage pad 160, the bit line structure 145, and the first interlayer insulating film 170. The second interlayer insulating film 180 may define a region of the storage pad 160 to form a plurality of isolation regions. Further, the second interlayer insulating film 180 may be patterned so as to expose a portion of the upper surface of the storage pad 160.

The second interlayer insulating film 180 may include an insulating material to electrically separate a plurality of storage pads 160 from one another. For example, the second interlayer insulating film 180 may include one of the silicon oxide film, the silicon nitride film, the silicon oxynitride film, and a combination thereof, but the present inventive concept is not limited thereto.

The information storage 190 may be formed on the second interlayer insulating film 180. The information storage 190 may be electrically connected to the storage pad 160. That is, the information storage 190 may be electrically connected to the storage contact 120. Since the storage contact 120 corresponds to the buried contact BC, the information storage 190 may be electrically connected to the buried contact BC.

The information storage 190 may include, for example, the capacitor, but the present inventive concept is not limited thereto. The information storage 190 may include the lower electrode 191, a capacitor insulating film 192, and an upper electrode 193.

The lower electrode 191 may have a cylinder shape. More specifically, the lower electrode 191 may include a sidewall portion 191s extending in a thickness direction of the substrate 100, and a bottom portion 191b parallel to the upper surface of the substrate 100. The bottom portion 191b of the lower electrode may connect the sidewall portion 191s of the lower electrode.

The capacitor insulating film 192 may be formed on the lower electrode 191. The capacitor insulating film 192 may be formed along a profile of the lower electrode 191. The capacitor insulating film 192 may be formed along an outer sidewall and an inner sidewall of the lower electrode 191. The capacitor insulating film 192 may also be formed on the second interlayer insulating film 180.

The upper electrode 193 may be formed on the capacitor insulating film 192. The upper electrode 193 may surround the outer sidewall of the lower electrode 191. Further, a portion of the upper electrode 193 may be disposed within and surrounded by the cylindrical sidewall portion 191s of the lower electrode.

The lower electrode 191 may include, for example, doped semiconductor material, conductive metal nitride (e.g., titanium nitride (TiN), tantalum nitride (TaN), or tungsten nitride (WN)), metal (e.g., ruthenium (Ru), iridium (Ir), titanium (Ti) or tantalum (Ta)), conductive metal oxide (e.g., iridium oxide ($IrO_2$) or ruthenium oxide ($RuO_2$)), and the like, but the present inventive concept is not limited thereto.

The capacitor insulating film 192 may include one of silicon oxide ($SiO_2$), silicon nitride ($Si_3N_4$), silicon oxynitride (SiON), hafnium oxide ($HfO_2$), hafnium silicon oxide (HfSiO), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide (Pb(Sc,Ta)O3), lead zinc niobate ($Pb(Zn_{1/3}Nb_{2/3})O_3$), and a combination thereof, but the present inventive concept is not limited thereto.

The upper electrode 193 may include, for example, at least one of doped semiconductor material, metal, conductive metal nitride, and metal silicide.

In FIGS. 2 and 3, as a bottom surface of the second portion 125b of the buried contact recess is formed to be higher than a bottom surface of the first portion 125a of the buried contact recess such that a distance between the bit line contact 146 and the storage contact 120 may increase. As a result, disturbance between the bit line contact 146 and the storage contact 120 may decrease. Further, gate induced drain leakage GIDL of the semiconductor device may be alleviated.

Figure 6:
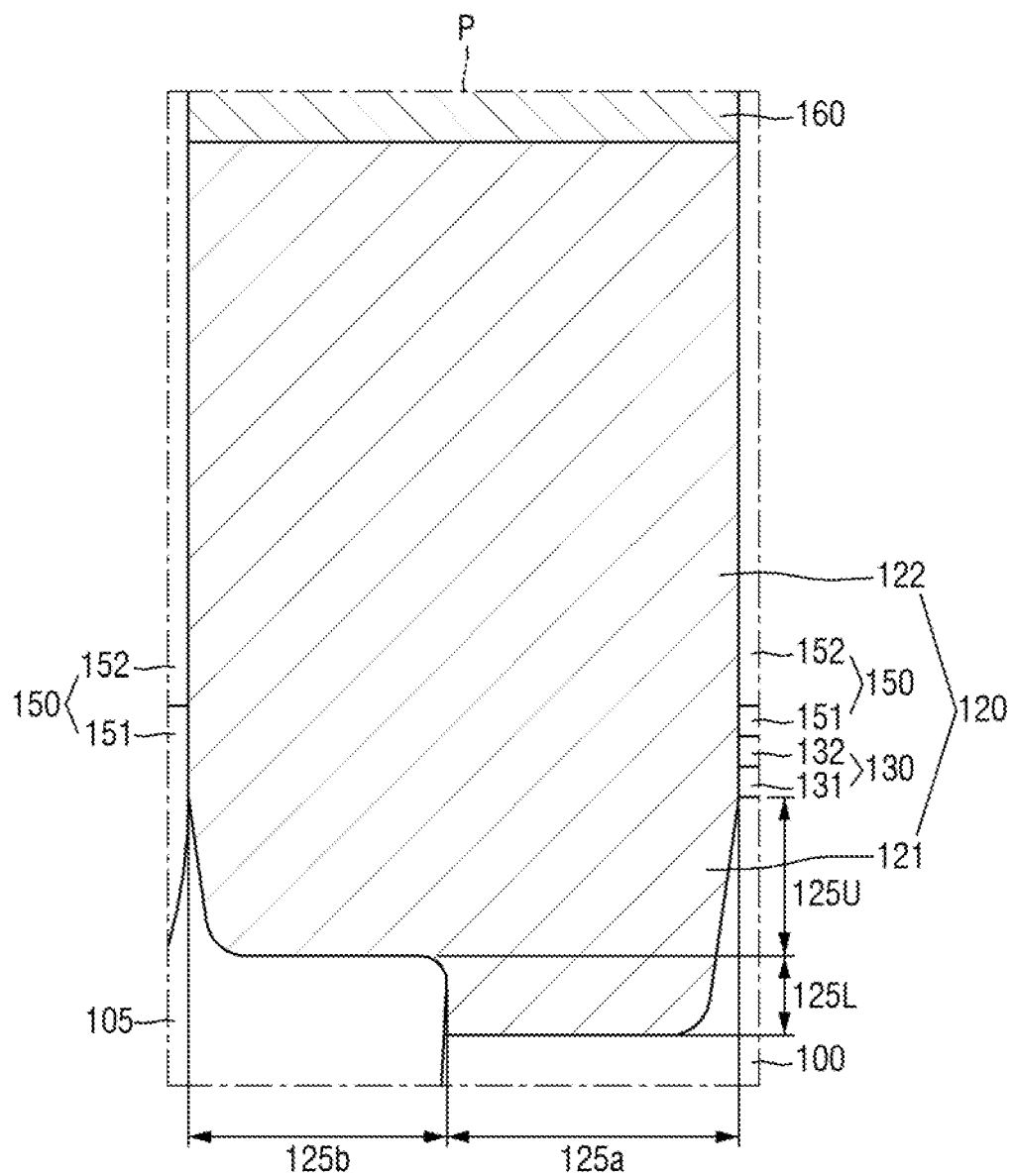
FIG. 6 is a view provided to explain a semiconductor device according to an exemplary embodiment of the present inventive concept.
Figure 7:
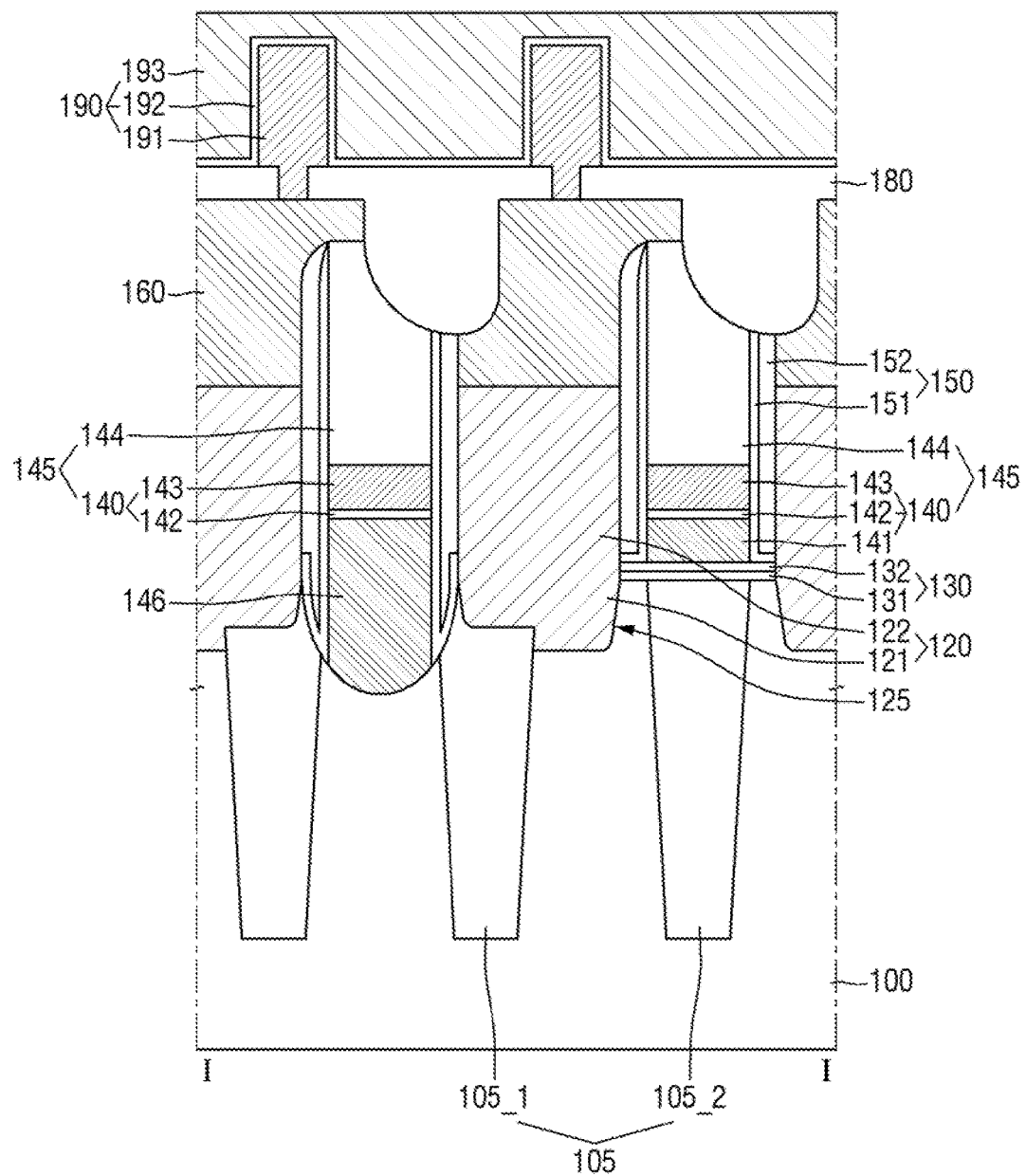
FIG. 7 is a view provided to explain a semiconductor device according to an exemplary embodiment of the present inventive concept.

FIG. 6 is a view provided to explain a semiconductor device according to an exemplary embodiment of the present inventive concept. FIG. 7 is also a view provided to explain a semiconductor device according to an exemplary embodiment of the present inventive concept. For convenience of explanation, differences that are not explained above with reference to FIGS. 1 to 5 will be mainly explained below.

For reference, FIG. 6 is an enlarged view of an encircled section P of FIG. 2.

Referring to FIG. 6, in the semiconductor device according to an exemplary embodiment of the present inventive concept, the connection portion between the first portion 125*a* of the buried contact recess and the second portion 125*b* of the buried contact recess may be rounded. That is, an upper portion of the connection sidewall connecting the bottom surface of the first portion 125*a* of the buried contact recess to the bottom surface of the second portion 125*b* of the buried contact recess may have a rounded shape.

Referring to FIG. 7, in the semiconductor device according to an exemplary embodiment of the present inventive concept, the lower electrode 191 may have a pillar shape elongated in a thickness direction of the substrate 100.

The capacitor insulating film 192 may be formed along the outer sidewall of the lower electrode 191. The upper electrode 193 may surround the outer sidewall of the lower electrode 191, but may not be disposed within the lower electrode 191.

Hereinbelow, a method of fabricating a semiconductor device according to an exemplary embodiment of the present inventive concept will be explained with reference to FIGS. 8A to 17B.

FIGS. 8A to 17B are views illustrating intermediate stages of fabrication, provided to explain a method of fabricating a semiconductor device according to an exemplary embodiment of the present inventive concept.

For reference, FIGS. 8A, 10A, 11A, 12A, 13A, 15A, 16A and 17A are views illustrating intermediate stages of fabrication, taken along line I-I of FIG. 1. FIGS. 8B, 9, 10B, 11B, 12B, 13B, 14, 15B, 16B and 17B are views illustrating intermediate stages of fabrication, taken along line II-II of FIG. 1.

Figure 8A:
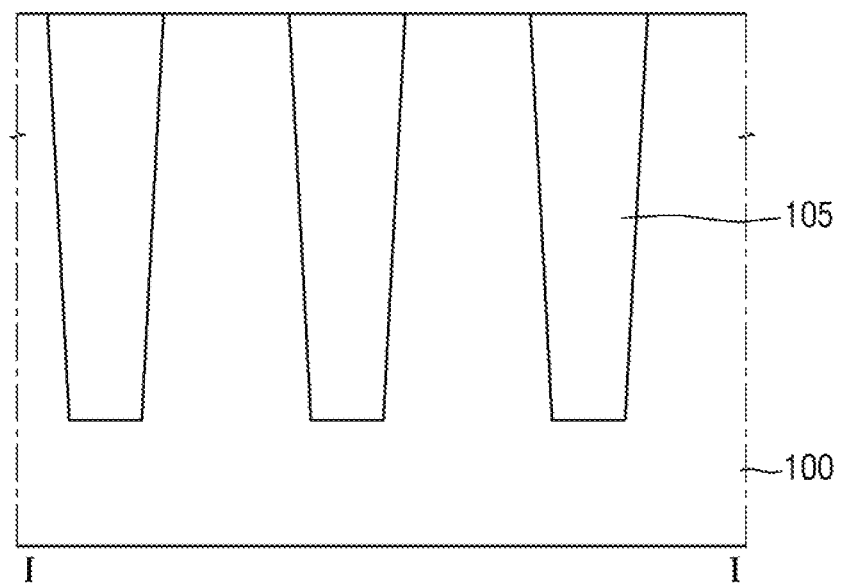
FIGS. 8A to 17B are views illustrating intermediate stages of fabrication, provided to explain a method of fabricating a semiconductor device according to an exemplary embodiment of the present inventive concept.
Figure 8B:
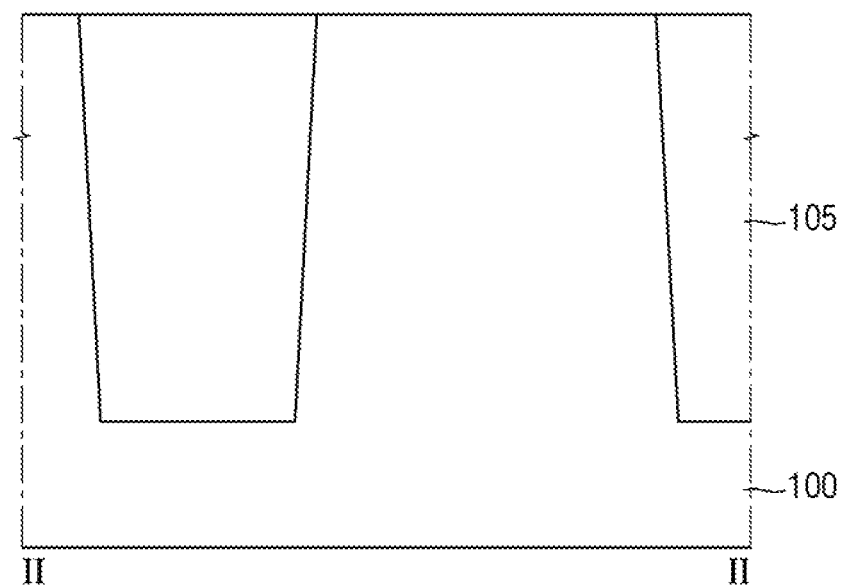

Referring to FIGS. 1, 8A, and 8B, the device isolation film 105 may be formed within the substrate 100. The substrate 100 may include the active region ACT defined by the device isolation film 105. For example, a device isolation trench may be formed within the substrate 100. The device isolation film 105 may be formed within the substrate 100 by filling the device isolation trench with an insulating material.

Figure 9:
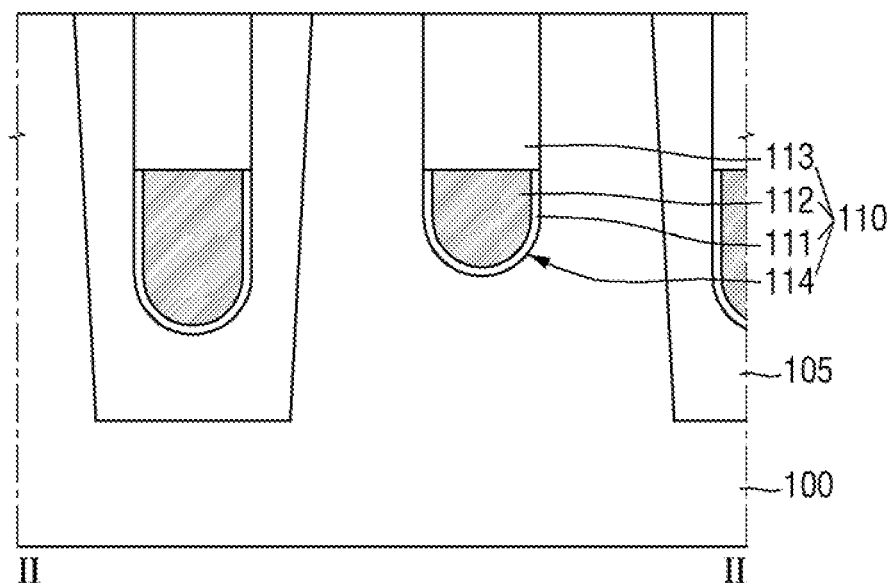

Referring to FIGS. 1 and 9, a plurality of gate structures 110 elongated in the first direction X may be formed within the substrate 100 and the device isolation film 105.

For example, the gate trench 114 extending in the first direction X may be formed within the substrate 100 and the device isolation film 105. Because etch rates of the substrate 100 and the device isolation film 105 may be different, a depth of the gate trench 114 within the substrate 100 may be different from a depth of the gate trench 114 within the device isolation film 105.

The gate insulating film 111 may be formed along a sidewall and a bottom surface of the gate trench 114. The gate insulating film 111 may extend along the upper surface of the substrate 100 and the upper surface of the device isolation film 105, but the present inventive concept is not limited thereto.

A gate conductive film for filling the gate trench 114 may be formed on the gate insulating film 111. The gate conductive film may be formed on the upper surface of the substrate 100 and the upper surface of the device isolating film 105.

Then, by removing a portion from the gate conductive film filling the gate trench 114, the gate electrode 112 for filling a portion of the gate trench 114 may be formed. The gate conductive film on the upper surface of the substrate 100 and the upper surface of the device isolation film 105 may also be removed. The gate conductive film for filling the gate trench 114 defined by the device isolation film 105, and the gate conductive film for filling the gate trench 114 defined by the substrate 100 may be simultaneously removed. Accordingly, based on the upper surface of the substrate 100, the upper surface of the gate electrode 112 within the device isolation film 105 and the upper surface of the gate electrode 112 within the substrate 100 may be positioned at substantially the same level. That is, the upper surface of the gate electrode 112 within the device isolation film 105 and the upper surface of the gate electrode 112 within the substrate 100 are about coplanar.

The gate insulating film 111 extending along the upper surface of the substrate 100 and the upper surface of the device isolation film 105, and a portion of the gate insulating film 111 formed on a sidewall of the gate trench 114 may be removed, but the present inventive concept is not limited thereto.

On the gate electrode 112, the gate capping pattern 113 for filling a portion of the gate trench 114 may be formed.

Figure 10A:
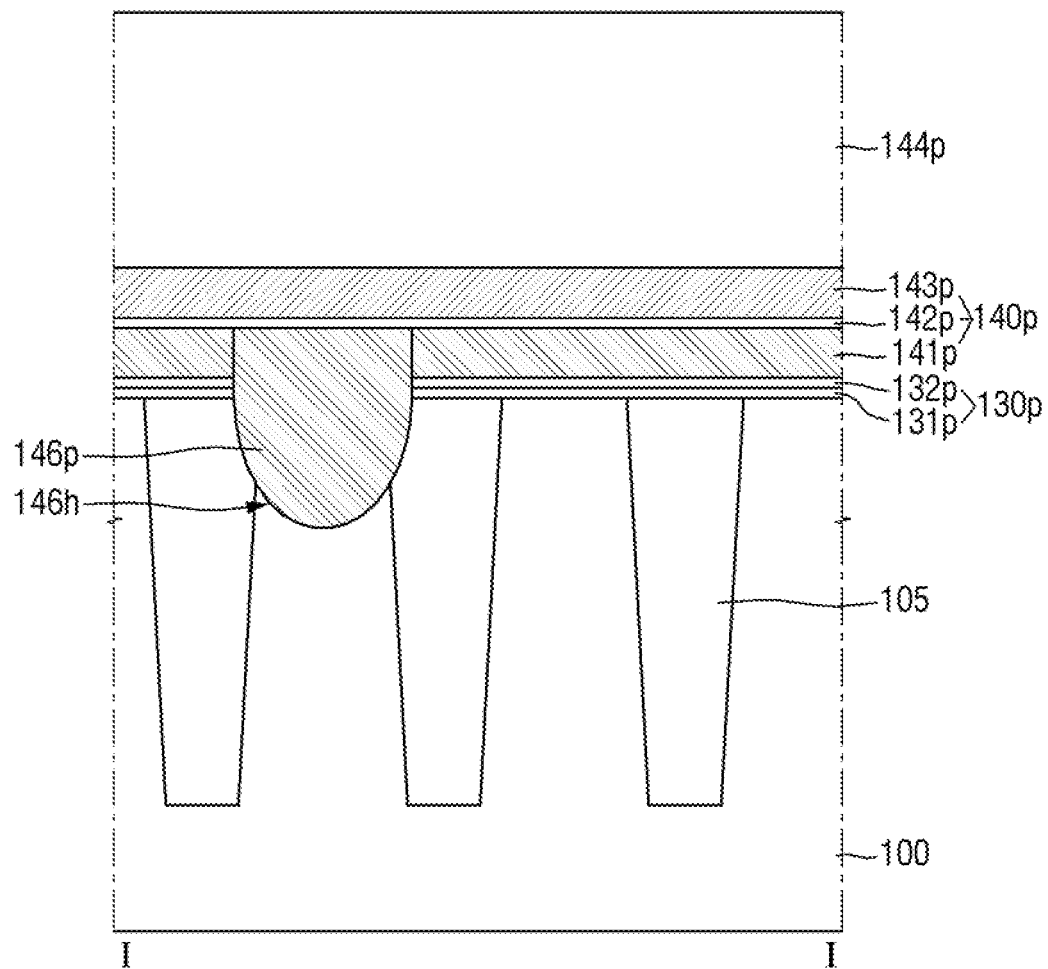
Figure 10B:
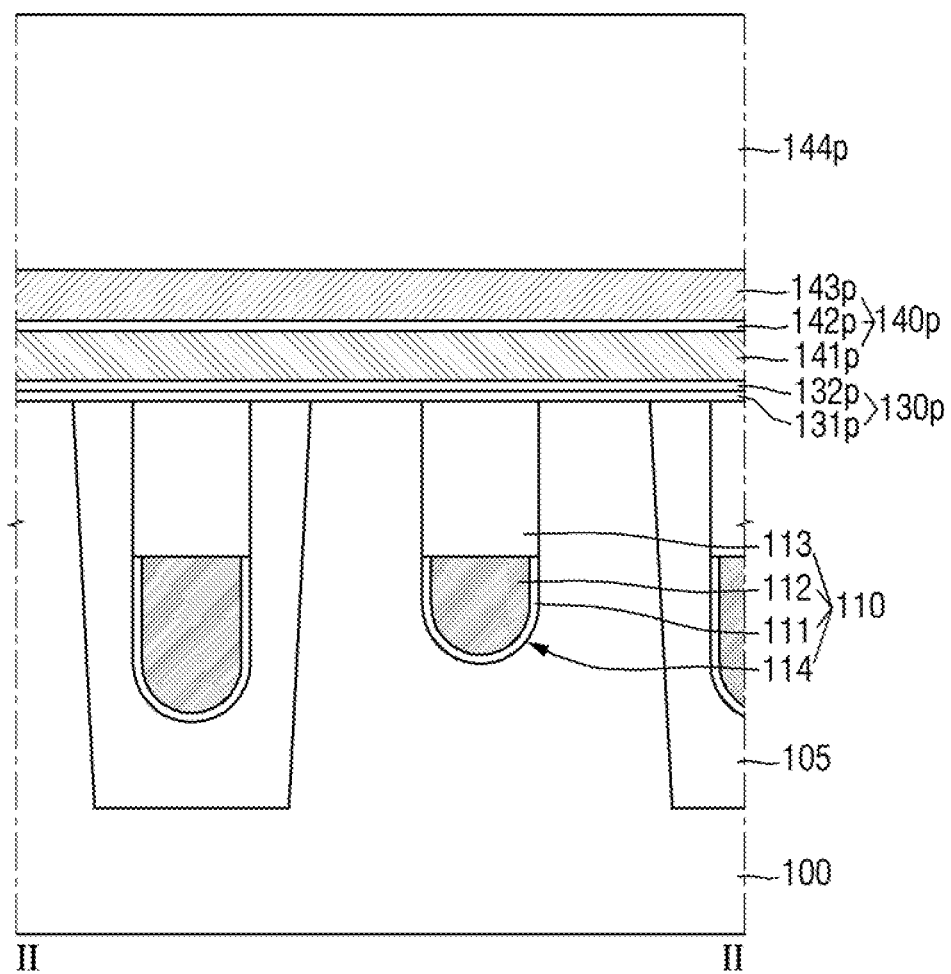

Referring to FIGS. 1, 10A and 10B, on the substrate 100 having a plurality of gate structures 110 formed therewith, a pre-cell insulating film 130*p*, a pre-wire conductive film 140*p* including a pre-bit line contact 146*p* connected with the substrate 100, and a pre-wire capping film 144*p* may be formed in a sequential order.

First, the pre-cell insulating film 130*p* may be formed on the substrate 100, the device isolation film 105, and the gate structure 110. A first pre-conductive film 141*p* may be formed on the pre-cell insulating film 130*p*.

The pre-cell insulating film 130*p* may include a first pre-cell insulating film 131*p* and a second pre-cell insulating film 132*p*, but the present inventive concept is not limited thereto.

Then, on a region where the bit line contact 146 is formed, a bit line contact hole 146*h* may be formed by removing the first pre-conductive film 141*p* and the pre-cell insulating film 130*p*. The pre-bit line contact 146*p* for filling the bit line contact hole 146*h* may be formed.

A second pre-conductive film 142*p* and a third pre-conductive film 143*p* may be formed in a sequential order on the pre-bit line contact 146*p* and the first pre-conductive film 141*p*. As a result, the pre-wire conductive film 140*p* including the first to third pre-conductive films 141*p*, 142*p*, 143*p* may be formed on the pre-cell insulating film 130*p*.

The pre-wire capping film 144*p* may then be formed on the pre-wire conductive film 140*p*.

Figure 11A:
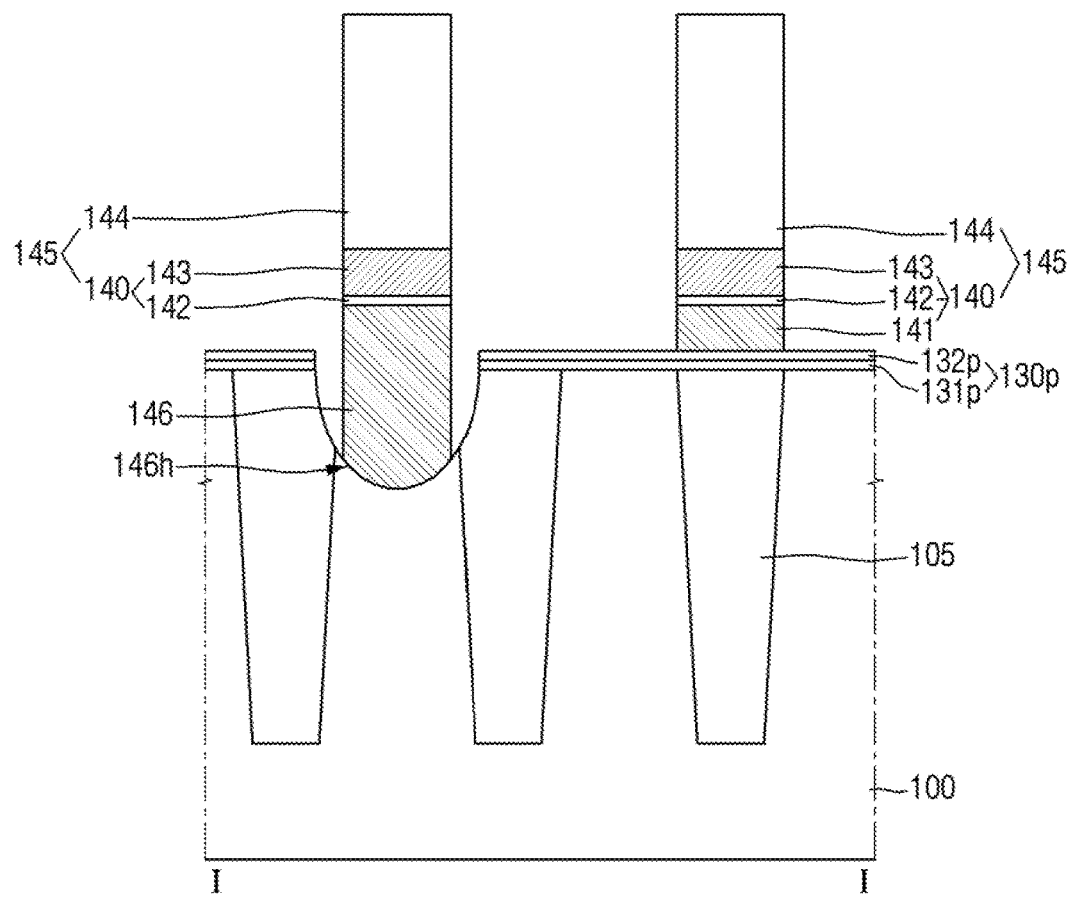
Figure 11B:
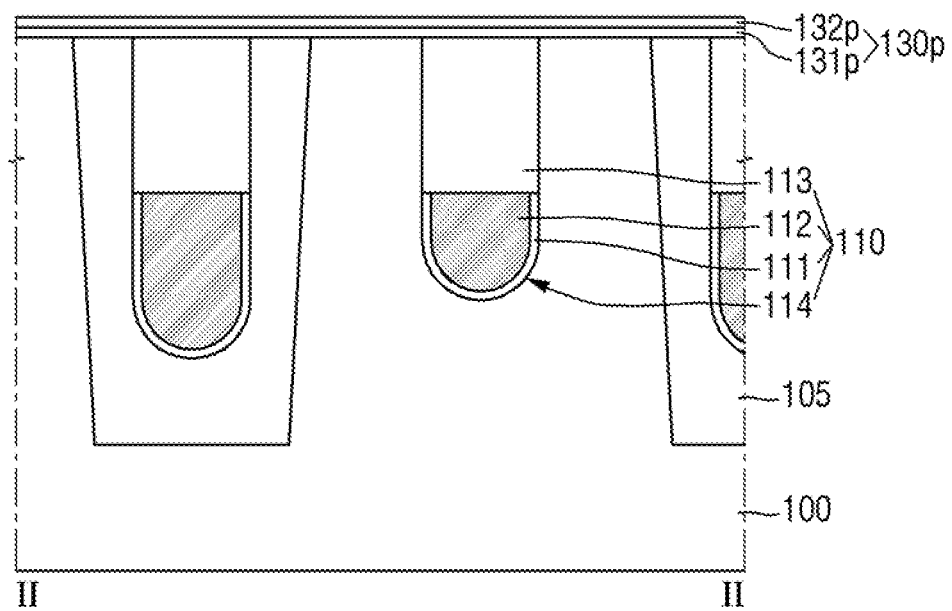

Referring to FIGS. 1, 11A and 11B, by patterning the pre-wire conductive film 140*p* and the pre-wire capping film 144*p*, a plurality of wire conductive films 140 and the wire capping film 144, which extend in the second direction Y, may be formed on the substrate 100 and the pre-cell insulating film 130*p*. That is, the bit line structure 145 may be formed on the substrate 100 and the pre-cell insulating film 130*p*. Further, the bit line contact 146 may be formed between the wire conductive film 140 and the substrate 100 by patterning the pre-bit line contact 146*p*.

The gate structure 110 formed within the substrate 100 and the device isolation film 105 may be overlain by the pre-cell insulating film 130*p*.

Figure 12A:
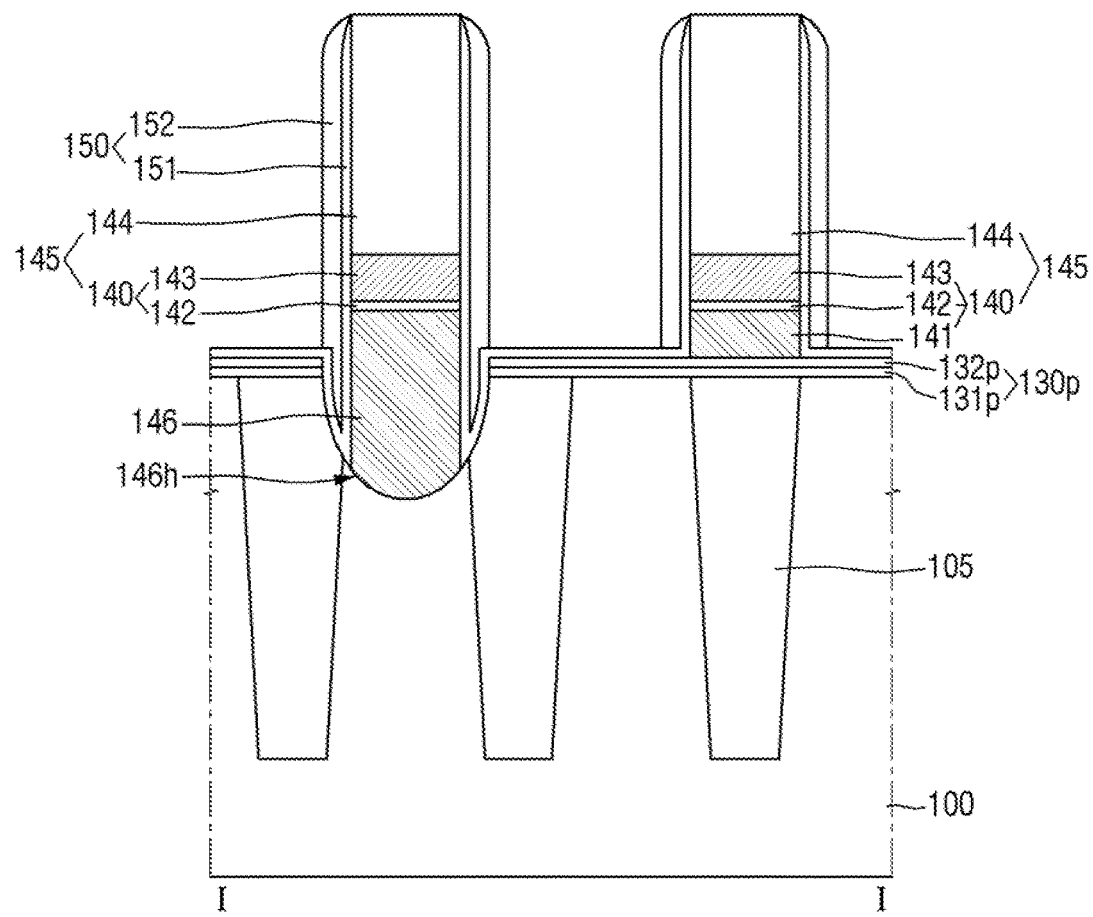
Figure 12B:
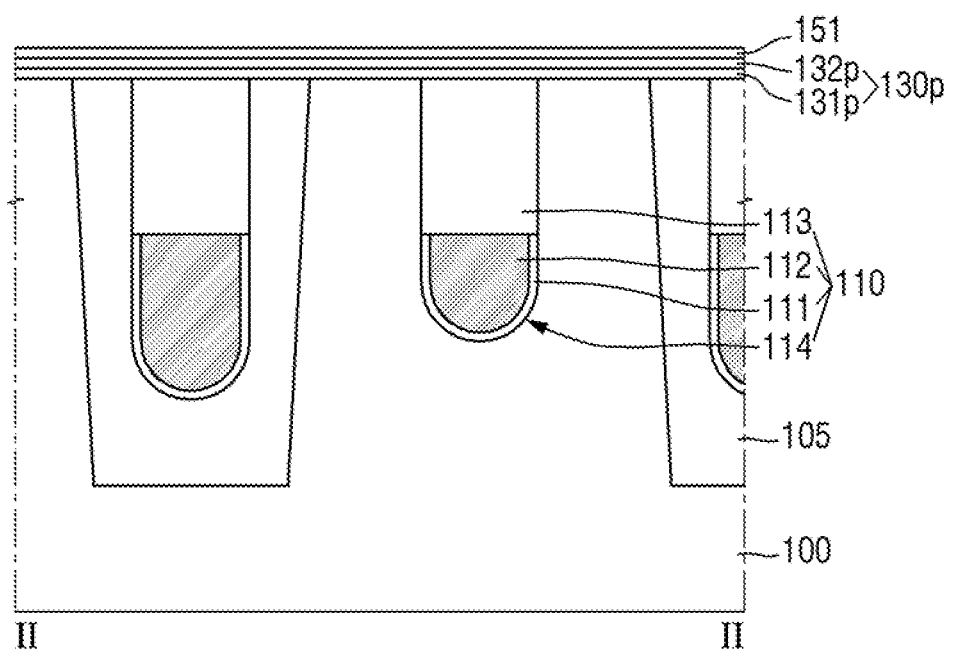

Referring to FIGS. 1, 12A and 12B, the wire spacer 150 may be formed on a sidewall of the bit line structure 145.

The wire spacer 150 may be formed on the substrate 100 and the device isolation film 105 at a portion of the wire conductive film 140 where the bit line contact 146 is formed. The wire spacer 150 may extend in the second direction Y along a sidewall of the bit line structure 145. Meanwhile, the wire spacer 150 may be formed on the pre-cell insulating film 130p at a remaining portion of the bit line structure 145 where the bit line contact 146 is not formed.

The wire spacer 150 may include the first spacer 151 and the second spacer 152, but the present inventive concept is not limited thereto. The first spacer 151 of the wire spacer 150 may be formed along the upper surface of the pre-cell insulating film 130p.

Figure 13A:
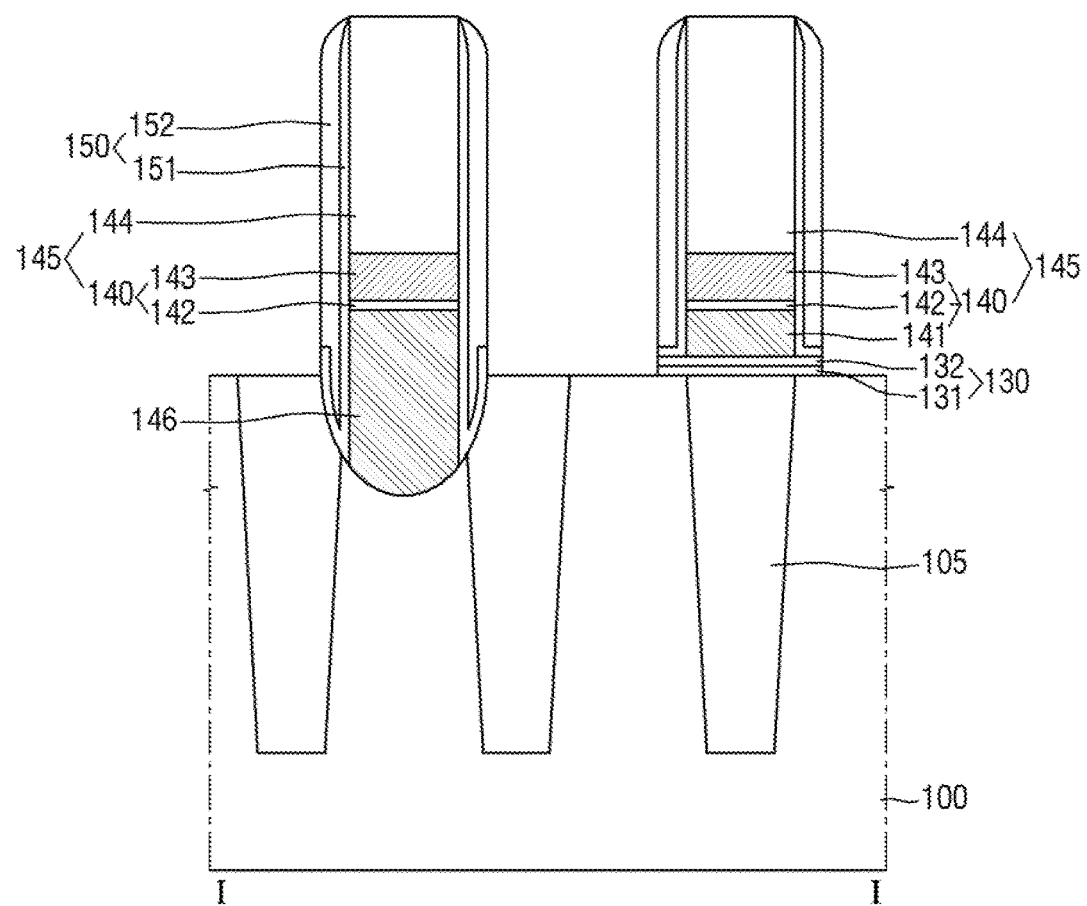
Figure 13B:
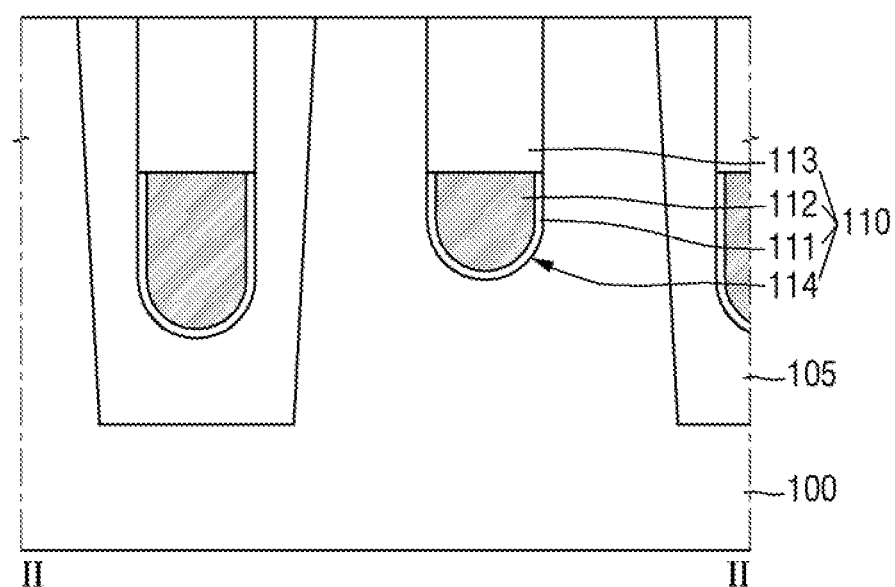

Referring to FIGS. 13A and 13B, in the bit line structure 145 and the wire spacer 150, the pre-cell insulating film 130p and the first spacer 151 not overlapping the second spacer 152 may be removed. As a result, the upper surfaces of the substrate 100 and the device isolation film 105 may be exposed. Further, the upper surface of the gate structure 110 may also be exposed.

Figure 14:
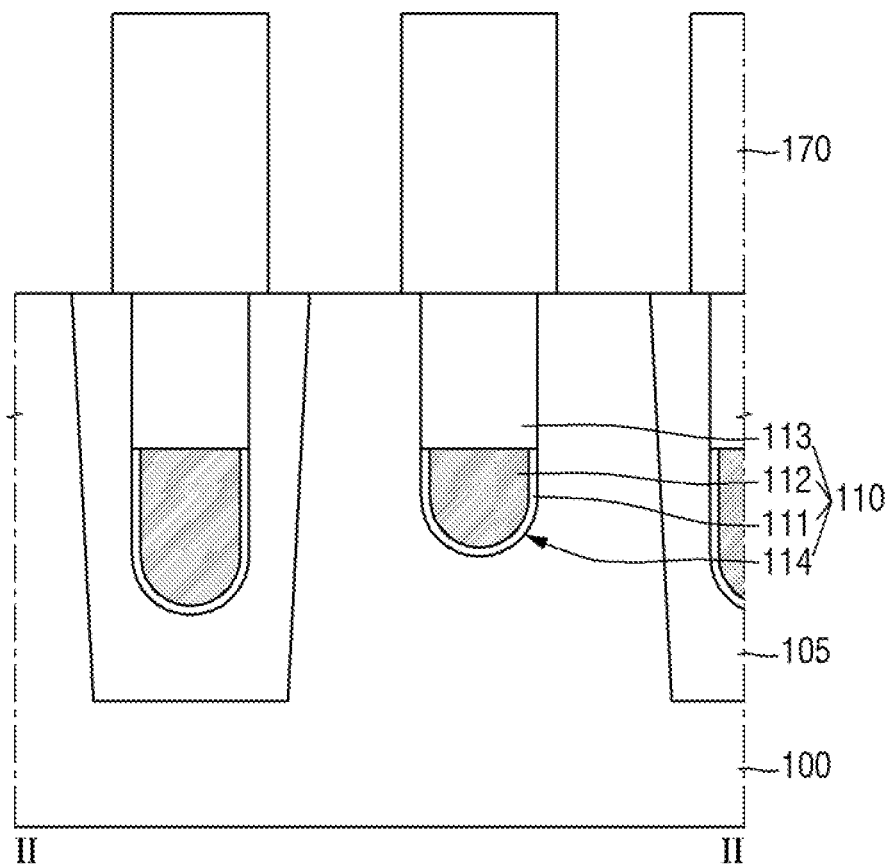

Referring to FIGS. 1 and 14, the interlayer insulating film 170 extending in the first direction X may be formed on the substrate 100 and the device isolation film 105. The first interlayer insulating film 170 may intersect the bit line structure 145 of FIG. 13A.

The first interlayer insulating film 170 may be formed to overlap the gate structure 110 formed within the substrate 100 and the device isolation film 105. As a result, the substrate 100 and the device isolation film 105 which are not overlain by the first interlayer insulating film 170 and the bit line structure 145 may be exposed. That is, the substrate 100 and the device isolation film 105 may be exposed between the adjacent gate structures 110 and between the adjacent wire conductive films 140.

Figure 15A:
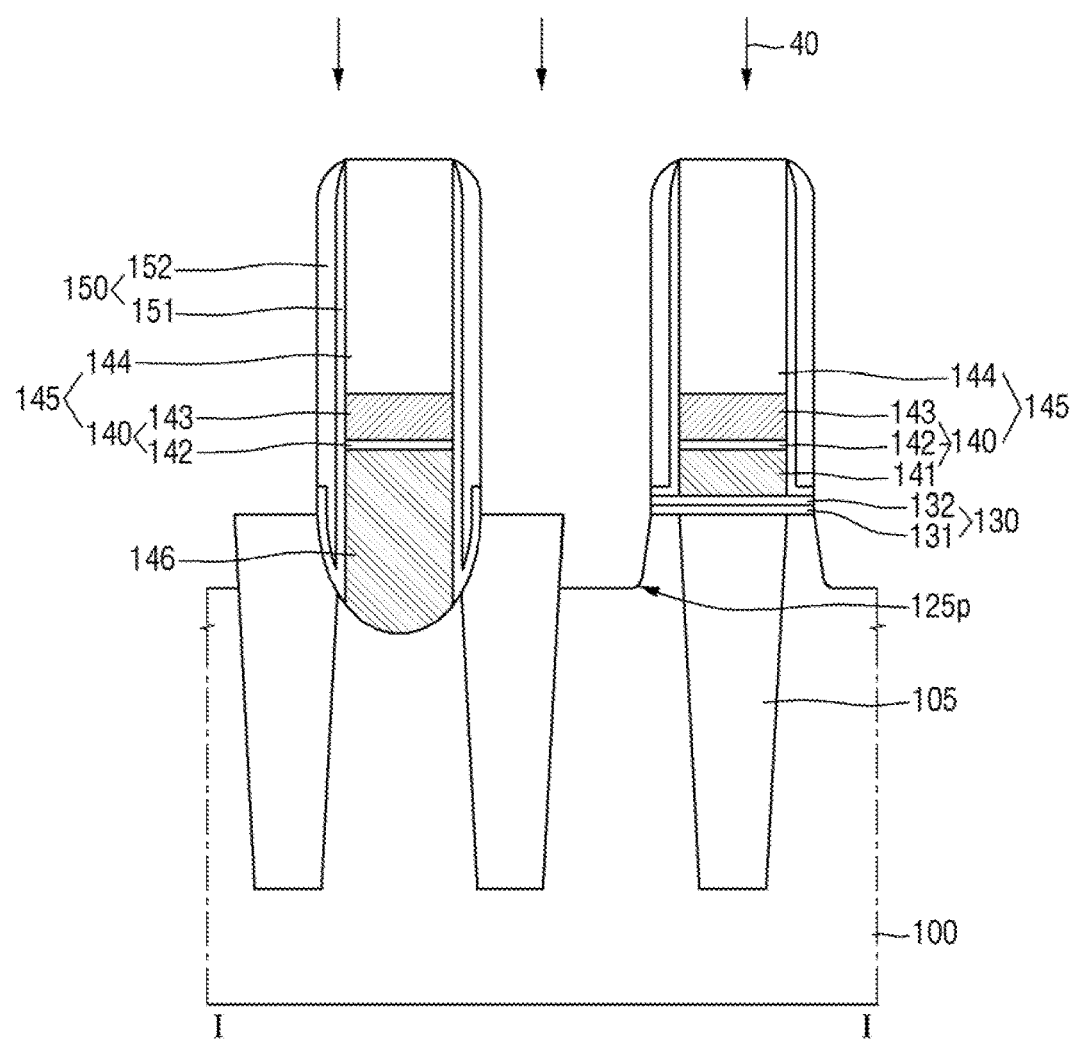
Figure 15B:
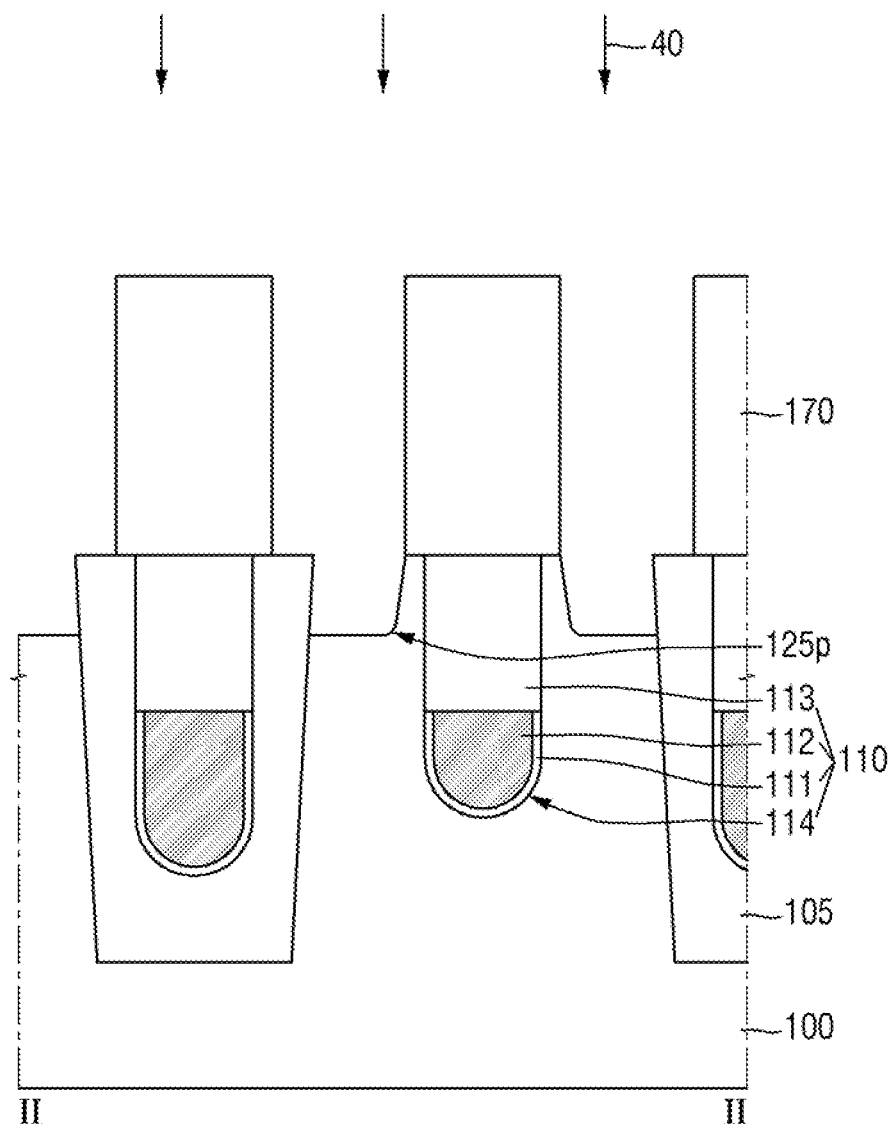

Referring to FIGS. 1, 15A and 15B, a pre-buried contact recess 125p may be formed within the substrate 100 by removing the substrate 100 between the adjacent gate structures 110 and between the adjacent wire conductive films 140.

The pre-buried contact recess 125p may be formed by using a first etch process 40. The first etch process 40 may selectively remove the substrate 100 by using an etchant having etch selectivity of the substrate 100 with respect to the device isolation film 105.

The first etch process 40 may be conducted by using the first interlayer insulating film 170 extending in the first direction X, the bit line structure 145 extending in the second direction Y, and the wire spacer 150, as a mask.

Figure 16A:
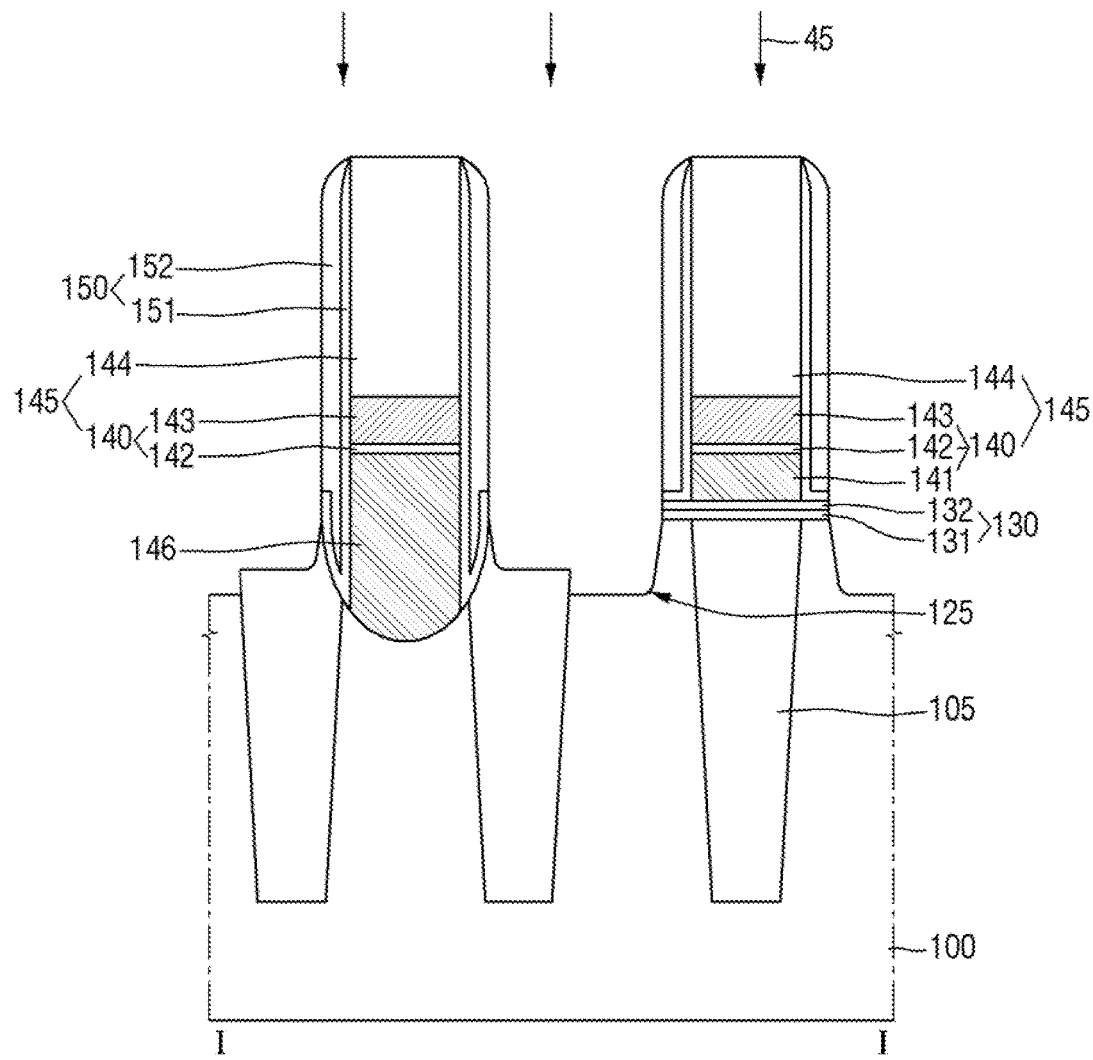
Figure 16B:
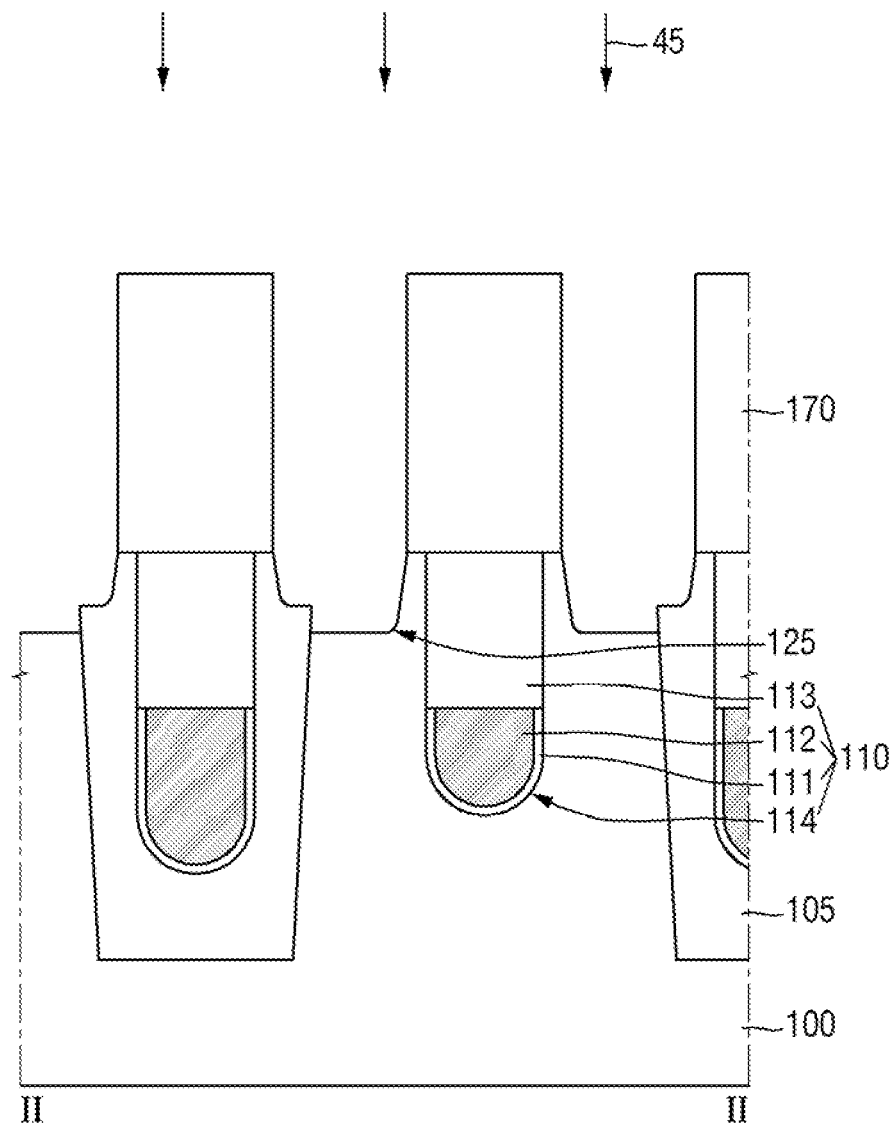

Referring to FIGS. 1, 16A and 16B, the buried contact recess 125 may be formed within the substrate 100 and the device isolation film 105 by removing the device isolation film 105 between the adjacent gate structures 110 and between the adjacent wire conductive films 140.

The device isolation film 105 may be formed by using a second etch process 45. The second etch process 45 may selectively remove the device isolation film by using the etchant having etch selectivity of the device isolation film 105 with respect to the substrate 100.

The second etch process 45 may be conducted by using the first interlayer insulating film 170 extending in the first direction X, the bit line structure 145 extending in the second direction Y, and the wire spacer 150, as a mask. As a result, the buried contact recess 125 may be formed within the substrate 100 and the device isolation film 105 by removing the substrate 100 and the device isolation film 105 between the adjacent gate structures 110 and between the adjacent wire conductive films 140.

A depth of the buried contact recess 125 vertically overlapping the substrate 100 may be greater than a depth of the buried contact recess 125 vertically overlapping the device isolation film 105.

In the method of fabricating the semiconductor device according to an exemplary embodiment of the present inventive concept, the first etch process 40 for removing the substrate 100 and the second etch process 45 for removing the device isolation film 105 may be conducted at different stages from each other. That is, the first etch process 40 for removing the substrate 100 may be conducted separately from the second etch process 45 for removing the device isolation film 45.

It is described herein that the first etch process 40 for removing the substrate 100 is conducted before the second etch process 45 for removing the device isolation film 105, but the present inventive concept is not limited thereto. That is, the second etch process 45 for removing the device isolation film 105 may be conducted first, followed by the first etch process 40 for removing the substrate 100.

Figure 17A:
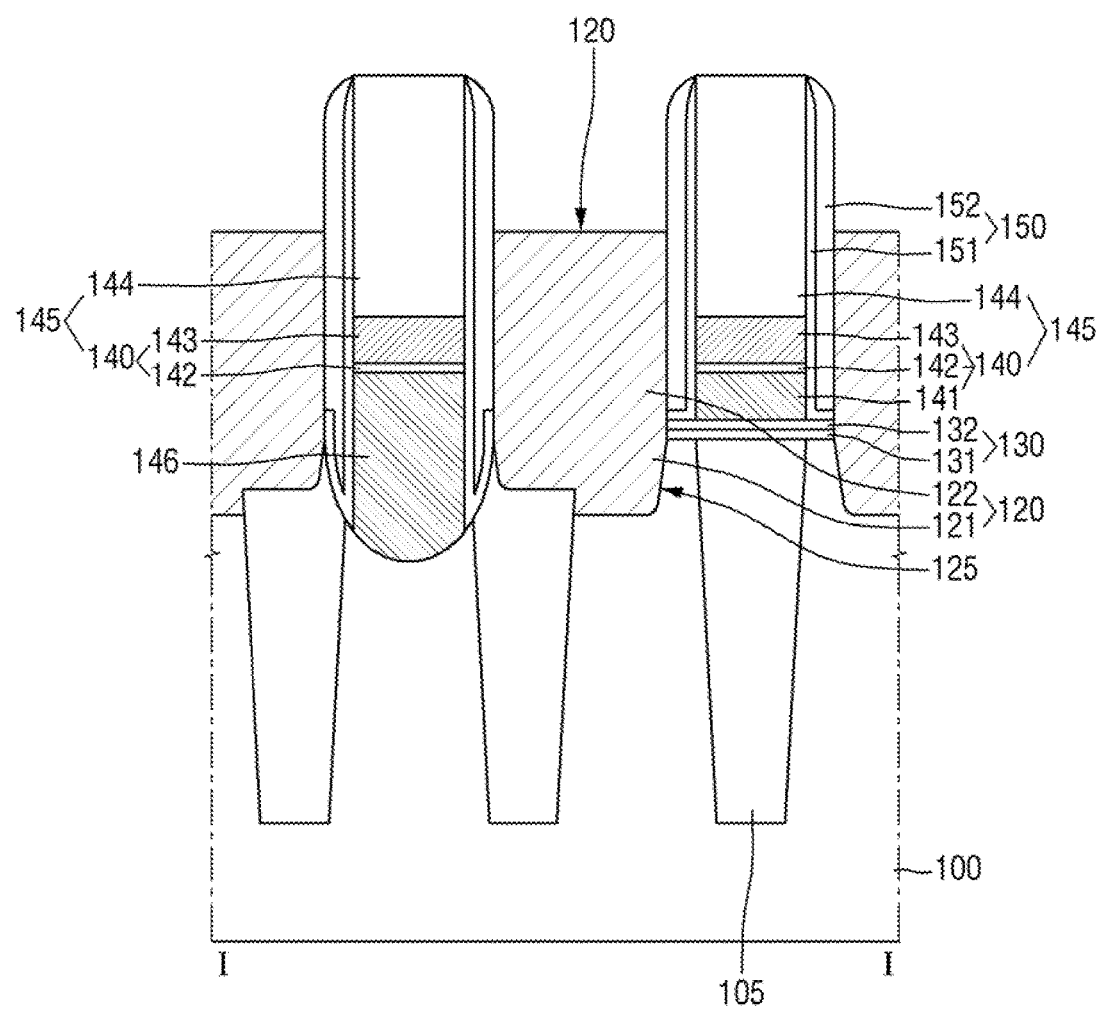
Figure 17B:
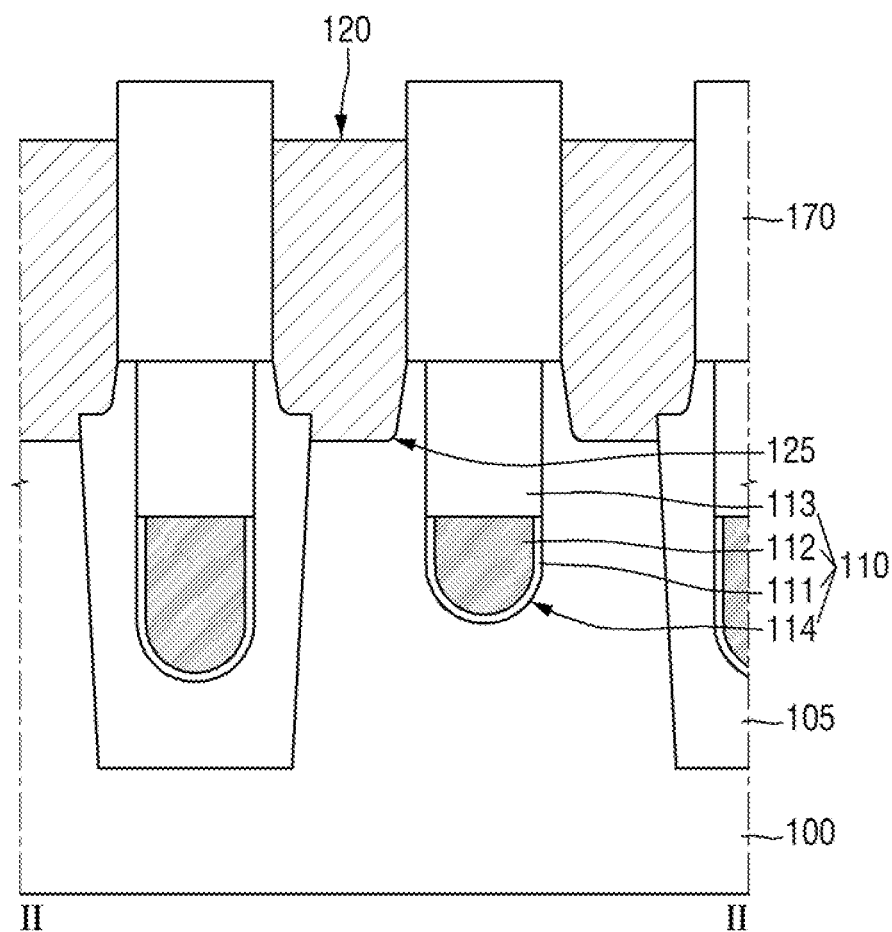

Referring to FIGS. 17A and 17B, the storage contact 120 for filling the buried contact recess 125 may be formed on the substrate 100 and the device isolation film 105 between the adjacent gate structures 110 and between the adjacent wire conductive films 140.

The storage contact 120 may be formed along a portion of the sidewall of the first interlayer insulating film 170 and a portion of the sidewall of the wire spacer 150.

Referring to FIGS. 2 and 4, the information storage 190 electrically connected to the storage contact 120 may be formed on the storage contact 120.

Figure 18A:
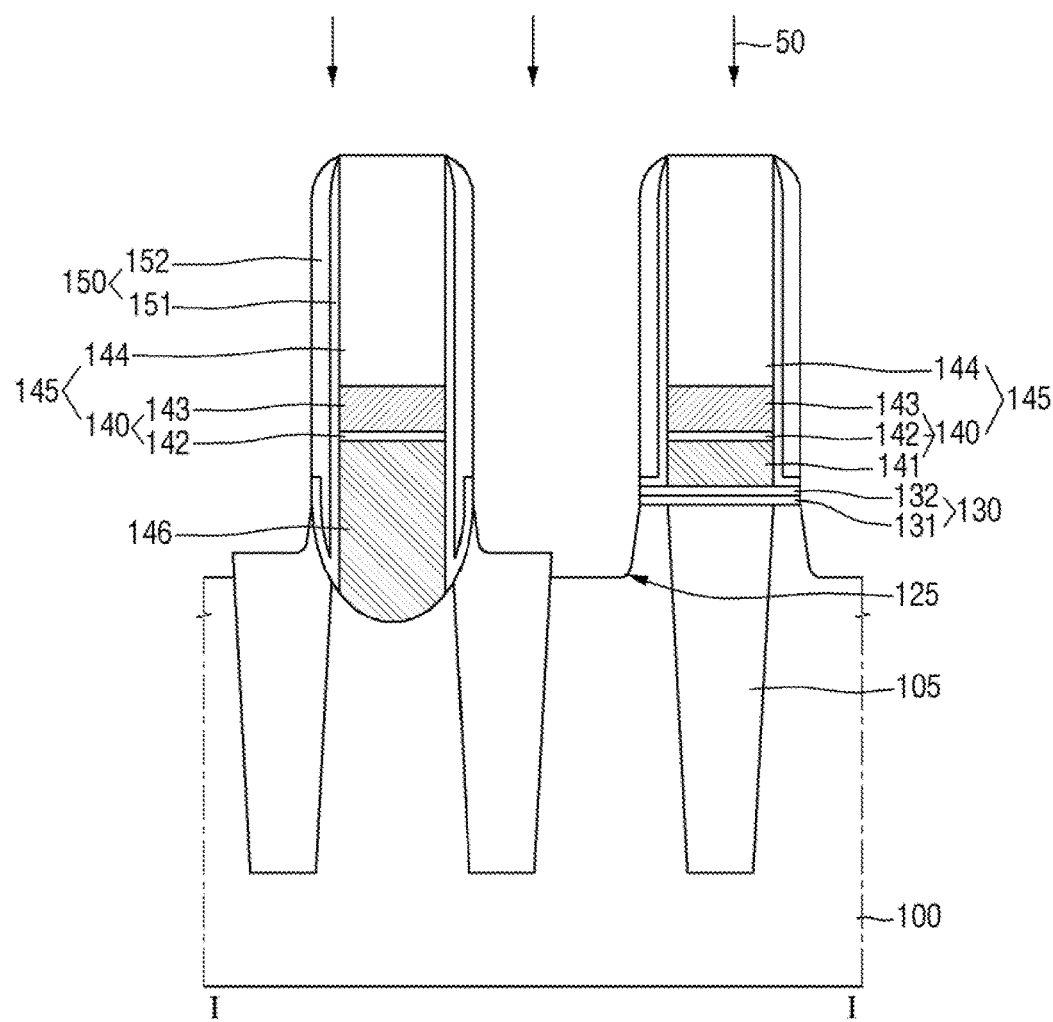
FIGS. 18A and 18B are views illustrating intermediate stages of fabrication, provided to explain a method of fabricating a semiconductor device according to an exemplary embodiment of the present inventive concept.
Figure 18B:
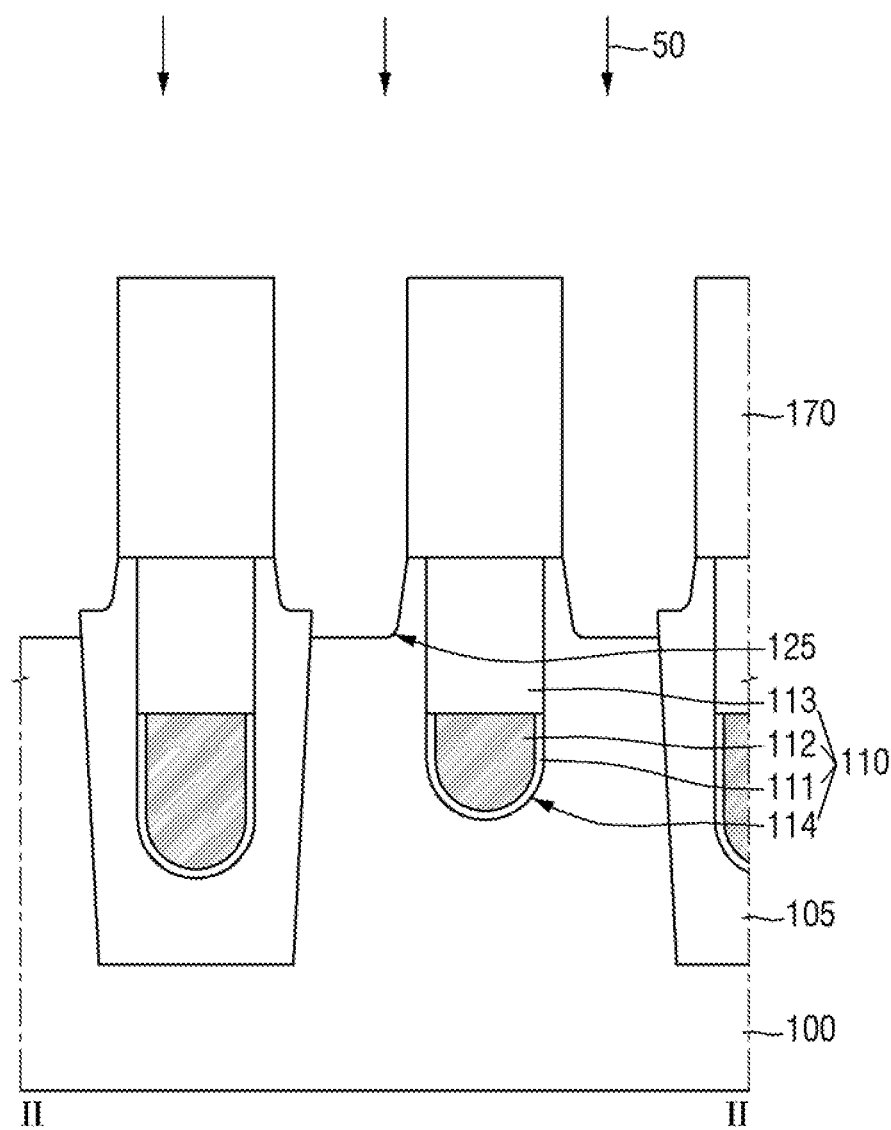

FIGS. 18A and 18B are views illustrating intermediate stages of fabrication, provided to explain a method of fabricating a semiconductor device according to an exemplary embodiment of the present inventive concept.

For reference, FIGS. 18A and 18B may be a process conducted after FIG. 14. Further, FIG. 18A is a view illustrating intermediate stages of fabrication taken along line I-I of FIG. 1, and FIG. 18B is a view illustrating intermediate stages of fabrication taken along line II-II of FIG. 1.

Referring to FIGS. 18A and 18B, the buried contact recess 125 may be formed within the substrate 100 by removing the substrate 100 and the device isolation film 105 between the adjacent gate structures 110 and between the adjacent wire conductive films 140.

The buried contact recess 125 may be formed by using a third etch process 50. The third etch process 50 may remove the substrate 100 and the device isolation film 105 simultaneously by using the etchant having greater etch rate to the substrate 100 than to the device isolation film 105.

Because etch rate to the substrate 100 is greater than etch rate to the device isolation film 105 in the third etch process 50, a depth of the buried contact recess 125 vertically overlapping the substrate 100 may be greater than a depth of the buried contact recess 125 vertically overlapping the device isolation film 105.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present exemplary embodiments be considered in all respects as illustrative and not restrictive.

What is claimed is:

1. A semiconductor device, comprising:
a substrate;
a device isolation film formed within the substrate;
a first gate structure formed within the substrate;
a recess formed on at least one side of the first gate structure and within the substrate and the device isolation film, the recess comprising an upper portion and a lower portion, wherein the lower portion of the recess is formed within the substrate and the upper portion of the recess is formed across the substrate and the device isolation film;
a buried contact filling the recess; and
an information storage electrically connected to the buried contact,
wherein a bottom surface of the upper portion on the device isolation film is connected to a bottom surface of the lower portion on the substrate by a connection sidewall defined by a sidewall of the device isolation film.

2. The semiconductor device of claim 1, wherein the lower portion of the recess is not formed within the device isolation film.

3. The semiconductor device of claim 1, wherein the recess comprises a first portion vertically overlapping the substrate, and a second portion vertically overlapping the device isolation film, and
a depth from an upper surface of the first gate structure to a bottom surface of the first portion of the recess is greater than a depth from the upper surface of the first gate structure to a bottom surface of the second portion of the recess.

4. The semiconductor device of claim 3, wherein a connection portion between a sidewall surface of the first portion of the recess and the bottom surface of the second portion of the recess is rounded.

5. The semiconductor device of claim 1, further comprising a second gate structure formed within the device isolation film, wherein the buried contact is positioned between the first gate structure and the second gate structure.

6. The semiconductor device of claim 5, wherein a distance from the information storage to a lowermost portion of the first gate structure is smaller than a distance from the information storage to a lowermost portion of the second gate structure.

7. The semiconductor device of claim 1, wherein the first gate structure comprises a gate trench formed within the substrate, a gate insulating film extending along a profile of at least a portion of the gate trench, a gate electrode on the gate insulating film filling the portion of the gate trench, and a capping pattern on the gate electrode filling the gate trench.

8. The semiconductor device of claim 7, wherein a distance from an upper surface of the first gate structure to an upper surface of the gate electrode is greater than a distance from the upper surface of the first gate structure to a bottom surface of the buried contact.

9. The semiconductor device of claim 1, wherein the information storage comprises a lower electrode, a capacitor insulating film on the lower electrode, and an upper electrode on the capacitor insulating film.

10. The semiconductor device of claim 9, wherein the lower electrode comprises a cylindrical sidewall portion extending in a thickness direction of the substrate, and a bottom portion connecting the cylindrical sidewall portion and being parallel to an upper surface of the substrate, and
a portion of the upper electrode is disposed within and surrounded by the cylindrical sidewall portion.

11. The semiconductor device of claim 9, wherein the lower electrode has a pillar shape extending in a thickness direction of the substrate.

12. A semiconductor device, comprising:
a substrate;
a device isolation film formed within the substrate;
a recess formed within the substrate and the device isolation film, and comprising a first portion vertically overlapping the substrate and a second portion vertically overlapping the device isolation film, wherein a depth of the first portion of the recess is greater than a depth of the second portion of the recess, and a bottom surface of the second portion of the recess is lower than an upper surface of the substrate;
a buried contact filling the recess; and
a capacitor electrically connected to the buried contact,
wherein a bottom surface of the first portion on the substrate is connected to the bottom surface of the second portion on the device isolation film by a connection sidewall defined by a sidewall of the device isolation film.

13. The semiconductor device of claim 12, further comprising:
a first bit line formed on the substrate, a second bit line formed on the device isolation film, and a direct contact electrically connecting the substrate and the first bit line, while having the buried contact interposed therebetween,
wherein the device isolation film has portions spaced from each other, and comprises a first portion of the device isolation film and a second portion of the device isolation film which are adjacent to each other,
the recess is formed within the first portion of the device isolation film and the substrate between the first portion of the device isolation film and the second portion of the device isolation film, and
the second bit line is formed on the second portion of the device isolation film.

14. The semiconductor device of claim 13, wherein a depth from the upper surface of the substrate to a bottom surface of the direct contact is greater than a depth from the upper surface of the substrate to a lowermost portion of the buried contact.

15. The semiconductor device of claim 12, further comprising a gate electrode formed within the substrate and the device isolation film and formed across the substrate and the device isolation film.

16. A semiconductor device, comprising:
a device isolation film within a substrate;
a plurality of word lines within the substrate and the device isolation film, the plurality of word lines formed across the substrate and the device isolation film and extending in a first direction;
a plurality of bit lines on the substrate and the device isolation film, the plurality of bit lines extending in a second direction different from the first direction and intersecting the word lines;
a buried contact between adjacent word lines and between adjacent bit lines, the buried contact overlapping the substrate and the device isolation film, wherein a height of the buried contact overlapping the substrate is greater than a height of the buried contact overlapping the device isolation film; and a capacitor electrically connected to the buried contact,
wherein a bottom surface of a part of the buried contact overlapping the substrate is connected to a bottom surface of a part of the buried contact overlapping the device isolation film by a connection sidewall defined by a sidewall of the device isolation film.

17. The semiconductor device of claim 16, wherein the buried contact comprises a first lower portion formed within the substrate and the device isolation film, and a first upper portion on the first lower portion, and
the first lower portion of the buried contact fills a recess formed within the substrate and the device isolation film.

18. The semiconductor device of claim 17, wherein the recess filled with the first lower portion of the buried contact comprises a second upper portion formed across the device isolation film and the substrate, and a second lower portion formed within the substrate, and
the second lower portion of the recess is not formed within the device isolation film.

19. The semiconductor device of claim 16, wherein the device isolation film defines an active region elongated in a third direction different from the first direction and the second direction.

20. The semiconductor device of claim 16, wherein the capacitor comprises a lower electrode, a capacitor insulating film on the lower electrode, and an upper electrode on the capacitor insulating film, and
the lower electrode has a cylindrical shape.

21. A semiconductor device, comprising:
a device isolation film defining an active region within a substrate;
first and second gate structures formed adjacent to each other within the substrate;
a direct contact electrically connected to the substrate between the first gate structure and the second gate structure;
a bit line on the direct contact;
a recess formed within the substrate and the device isolation film, and comprising a first portion vertically overlapping the substrate and a second portion vertically overlapping the device isolation film, wherein a depth of the first portion of the recess is greater than a depth of the second portion of the recess;
a buried contact filling the recess, wherein the first gate structure is positioned between the buried contact and the direct contact; and
a capacitor electrically connected to the buried contact,
wherein a bottom surface of the first portion on the substrate is connected to a bottom surface of the second portion on the device isolation film by a connection sidewall defined by a sidewall of the device isolation film.

22. The semiconductor device of claim 21, wherein a depth from an upper surface of the first gate structure to a bottom surface of the direct contact is greater than a depth from the upper surface of the first gate structure to a lowermost portion of the buried contact.

23. The semiconductor device of claim 21, wherein the first gate structure comprises a gate trench formed within the substrate, a gate insulating film extending along a profile of at least a portion of the gate trench, a gate electrode on the gate insulating film filling the portion of the gate trench, and a capping pattern on the gate electrode filling the gate trench, and
a depth from an upper surface of the first gate structure to a bottom surface of the direct contact is smaller than a depth from the upper surface of the first gate structure to a lower surface of the capping pattern.

24. A method for fabricating a semiconductor device, comprising:
forming a device isolation film within a silicon substrate;
forming a plurality of word lines extending in a first direction within the silicon substrate and the device isolation film;
forming a plurality of bit lines extending in a second direction different from the first direction on the silicon substrate;
forming a recess within the silicon substrate and the device isolation film by removing the silicon substrate and the device isolation film between adjacent word lines and between adjacent bit lines;
forming a buried contact filling the recess; and
forming a capacitor on the buried contact, with the capacitor being electrically connected to the buried contact,
wherein the recess comprises a first portion vertically overlapping the silicon substrate, and a second portion vertically overlapping the device isolation film, and
a depth from an upper surface of the silicon substrate to a bottom surface of the first portion of the recess is greater than a depth from the upper surface of the silicon substrate to a bottom surface of the second portion of the recess,
wherein the bottom surface of the first portion on the silicon substrate is connected to the bottom surface of the second portion on the device isolation film by a connection sidewall defined by a sidewall of the device isolation film.

25. The method of claim 24, wherein the forming of the recess comprises a first etch process of removing the silicon substrate, and a second etch process of removing the device isolation film, and
the first etch process and the second etch process are conducted at different stages from each other.

26. The method of claim 24, wherein the forming of the recess comprises an etch process which simultaneously removes the silicon substrate and the device isolation film.

27. A semiconductor device, comprising:
a substrate;
a device isolation film formed within the substrate, the device isolation film comprising a first portion and a second portion adjacent to and spaced apart from the first portion;
a first bit line formed on the substrate, and a second bit line formed on the second portion of the device isolation film;
a bit line contact formed to electrically connect the first bit line and the substrate, at one side of the first portion of the device isolation film away from the second portion of the device isolation film;
a buried contact formed between the first bit line and the second bit line, the buried contact overlapping the substrate and the first portion of the device isolation film; and
a capacitor formed over the buried contact and electrically connected to the buried contact,
wherein a height of the buried contact overlapping the substrate is greater than a height of the buried contact overlapping the first portion of the device isolation film,
wherein a bottom surface of a part of the buried contact overlapping the substrate is connected to a bottom surface of a part of the buried contact overlapping the first portion of the device isolation film by a connection sidewall defined by a sidewall of the device isolation film.

28. The semiconductor device of claim 27, wherein a depth from an upper surface of the substrate to a bottom surface of the bit line contact is greater than a depth from the upper surface of the substrate to a lowermost portion of the buried contact.

* * * * *